US010717117B2

(12) United States Patent
Osada et al.

(10) Patent No.: US 10,717,117 B2
(45) Date of Patent: Jul. 21, 2020

(54) SUBSTRATE PROCESSING APPARATUS AND SUBSTRATE PROCESSING METHOD

(71) Applicant: SCREEN Holdings Co., Ltd., Kyoto (JP)

(72) Inventors: Naoyuki Osada, Kyoto (JP); Takahiro Yamaguchi, Kyoto (JP); Eri Fujita, Kyoto (JP); Akihisa Iwasaki, Kyoto (JP); Ayumi Higuchi, Kyoto (JP); Shota Iwahata, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 225 days.

(21) Appl. No.: 15/874,928

(22) Filed: Jan. 19, 2018

(65) Prior Publication Data

US 2018/0236510 A1    Aug. 23, 2018

(30) Foreign Application Priority Data

Feb. 22, 2017 (JP) .................................. 2017-031485
Oct. 26, 2017 (JP) .................................. 2017-207355

(51) Int. Cl.
  *B08B 17/02*   (2006.01)
  *B08B 3/08*    (2006.01)
  *B08B 3/10*    (2006.01)
  *H01L 21/67*   (2006.01)
  *B08B 3/04*    (2006.01)

(52) U.S. Cl.
  CPC ............ *B08B 17/025* (2013.01); *B08B 3/041* (2013.01); *B08B 3/08* (2013.01); *B08B 3/10* (2013.01);
(Continued)

(58) Field of Classification Search
  CPC ......... B08B 17/025; B08B 3/041; B08B 3/08; B08B 3/10; B08B 2203/007;
(Continued)

(56) References Cited

U.S. PATENT DOCUMENTS

| 8,464,736 B1* | 6/2013 | Lenz ................. H01L 21/67051 134/103.1 |
| 2003/0111178 A1 | 6/2003 | Morita ..................... 156/345.33 |

(Continued)

FOREIGN PATENT DOCUMENTS

| CN | 106104762 A | 11/2016 |
| JP | 2005155878 A * | 6/2005 |

(Continued)

OTHER PUBLICATIONS

JP2005155878A—machine translation (Year: 2005).*

*Primary Examiner* — Tinsae B Ayalew
(74) *Attorney, Agent, or Firm* — Ostrolenk Faber LLP

(57) ABSTRACT

The substrate processing apparatus includes common piping which guides a processing liquid to a branching portion, supply piping which guides the processing liquid from the branching portion to a chemical liquid nozzle, return piping which guides the processing liquid from the branching portion, and a discharge valve which changes a flow rate of the processing liquid supplied from the common piping to the branching portion. The discharge valve makes a valve element stationary at a plurality of positions including a discharge execution position at which the processing liquid is supplied from the common piping to the branching portion at a flow rate larger than a maximum value of a suction flow rate and a discharge stop position at which the processing liquid is supplied from the common piping to the branching portion at a flow rate smaller than the maximum value of the suction flow rate.

7 Claims, 12 Drawing Sheets

(52) U.S. Cl.
CPC .. *H01L 21/67017* (2013.01); *H01L 21/67028* (2013.01); *H01L 21/67051* (2013.01); *H01L 21/67253* (2013.01); *B08B 2203/007* (2013.01)

(58) Field of Classification Search
CPC ......... H01L 21/67017; H01L 21/67028; H01L 21/67051; H01L 21/67253
USPC ........................................................ 134/109
See application file for complete search history.

(56) References Cited

U.S. PATENT DOCUMENTS

| | | | |
|---|---|---|---|
| 2011/0023909 A1 | 2/2011 | Ito | .................................. 134/18 |
| 2012/0175819 A1* | 7/2012 | Miya | ................. H01L 21/02052 264/334 |
| 2015/0053285 A1 | 2/2015 | Nakashima et al. | |
| 2017/0014873 A1 | 1/2017 | Higuchi et al. | |

FOREIGN PATENT DOCUMENTS

| | | |
|---|---|---|
| JP | 3990567 B2 | 10/2007 |
| JP | 2009-222189 A | 10/2009 |
| JP | 5753352 B2 | 7/2015 |
| JP | 2015-177090 A | 10/2015 |
| JP | 5887089 B2 | 3/2016 |
| JP | 2016-115844 A | 6/2016 |
| KR | 10-2011-0013251 A | 2/2011 |
| KR | 10-2011-0065340 A | 6/2011 |
| KR | 10-2015-0022687 A | 3/2015 |

* cited by examiner

DISCHARGE IS EXECUTED

DISCHARGE IS STOPPED

DISCHARGE IS EXECUTED

SUBSTRATE PROCESSING APPARATUS AND SUBSTRATE PROCESSING METHOD

BACKGROUND OF THE INVENTION

1. Field of the Invention

The present invention relates to a substrate processing apparatus and a substrate processing method which process a substrate. Substrates to be processed include, for example, semiconductor wafers, substrates for liquid crystal displays, substrates for plasma displays, substrates for FEDs (field emission displays), substrates for optical disks, substrates for magnetic disks, substrates for magneto-optical disks, substrates for photomasks, ceramic substrates, substrates for solar cells, etc.

2. Description of Related Art

In manufacturing processes for semiconductor devices and liquid crystal displays, substrate processing apparatuses are used for processing substrates such as semiconductor wafers or glass panels for liquid crystal displays.

JP 2009222189 A discloses a single substrate processing type substrate processing apparatus which processes substrates one at a time. The substrate processing apparatus includes a spin chuck which rotates a substrate while horizontally holding the substrate and a processing liquid supplying device which supplies a processing liquid to the substrate held by the spin chuck. The processing liquid supplying device includes a nozzle which discharges the processing liquid toward the substrate, supply piping which supplies the processing liquid to the nozzle, and a valve which is interposed in the supply piping. The processing liquid flowing through the supply piping is supplied to the nozzle by opening the valve. Thereby, the processing liquid is discharged from the nozzle and supplied to the substrate. The valve is closed by causing a valve element to come into contact with a valve seat and opened by causing the valve element to move away from the valve seat.

Whether discharge of the processing liquid from the nozzle is executed or stopped is switched by opening and closing the valve. However, when the valve is opened and closed, the valve element is rubbed against the valve seat, thus resulting in generation of minute particles inside the valve. The particles inside the valve are consequently discharged from the nozzle together with the processing liquid. Therefore, the processing liquid containing the particles is supplied to a substrate, affecting cleanliness of the substrate.

SUMMARY OF THE INVENTION

A preferred embodiment of the present invention provides a substrate processing apparatus that includes a substrate holding unit which holds a substrate, a nozzle which discharges a processing liquid toward the substrate held by the substrate holding unit, a liquid sending device which sends the processing liquid to be supplied to the substrate held by the substrate holding unit, common piping which guides the processing liquid sent by the liquid sending device and which is always open such that the processing liquid flows through the common piping, a branching portion which is connected to the common piping, supply piping which guides the processing liquid guided by the common piping from the branching portion to the nozzle and which is always open such that the processing liquid flows through the supply piping, return piping which guides the processing liquid guided by the common piping from the branching portion along a flow channel different from the supply piping and which is always open such that the processing liquid flows through the return piping, a suction device which sucks the processing liquid from the branching portion toward the return piping, and a discharge valve which is disposed on the common piping and changes a flow rate of the processing liquid to be supplied from the common piping to the branching portion.

The discharge valve includes a valve body which includes an annular valve seat which surrounds an inner flow channel through which the processing liquid flows, a valve element which is arranged on the inner flow channel and which is movable with respect to the valve seat, and a valve actuator which causes the valve element to be stationary at a plurality of positions including a discharge execution position at which the valve element is away from the valve seat and the processing liquid is supplied from the common piping to the branching portion at a flow rate larger than a maximum value of a suction flow rate which represents a flow rate of the processing liquid which flows from the branching portion to the return piping by a suction force of the suction device and a discharge stop position at which the valve element is away from the valve seat and the processing liquid is supplied from the common piping to the branching portion at a flow rate smaller than the maximum value of the suction flow rate.

According to this arrangement, the processing liquid to be supplied to the nozzle is guided from the common piping to the branching portion. The processing liquid supplied from the branching portion to the supply piping is discharged from the nozzle and supplied to a substrate. Thereby, the substrate is processed. On the other hand, the processing liquid supplied from the branching portion to the return piping is guided by the return piping to a recovery mechanism or a drain mechanism.

The processing liquid supplied from the common piping to the branching portion is drawn by a suction force of the suction device to the return piping. The processing liquid supplied from the common piping to the branching portion is changed in flow rate by the discharge valve. The discharge valve moves the valve element between the discharge execution position and the discharge stop position, thereby changing a flow rate of the processing liquid supplied from the common piping to the branching portion. Thus, a state of supplying the processing liquid to the supply piping is switched.

Specifically, a flow rate of the processing liquid supplied from the common piping to the branching portion when the valve element is arranged at the discharge execution position is larger than a maximum value of the flow rate of the processing liquid which flows from the branching portion to the return piping. Therefore, a part of the processing liquid supplied to the branching portion is supplied to the return piping, and a remaining part of the processing liquid which has been supplied to the branching portion is supplied to the supply piping. Thereby, the processing liquid is discharged from the nozzle and supplied to the substrate.

On the other hand, the flow rate of the processing liquid supplied from the common piping to the branching portion when the valve element is arranged at the discharge stop position is smaller than the maximum value of the flow rate of the processing liquid which flows from the branching portion to the return piping. Therefore, all or substantially all the processing liquid supplied to the branching portion is supplied to the return piping. Even if some processing liquid flows from the branching portion to the supply piping, the processing liquid will not reach the nozzle. Therefore, no processing liquid is discharged from the nozzle.

As described above, discharge of the processing liquid from the nozzle and stop of discharge thereof are not switched by opening and closing the supply piping with the use of an opening/closing valve but switched by changing an aperture of the discharge valve disposed on the common piping. The discharge stop position at which discharge of the processing liquid from the nozzle is stopped is a position at which the valve element is separated from the valve seat. Therefore, foreign matter contained in the processing liquid supplied to the nozzle is smaller than in the case where the supply piping is opened and closed by the opening/closing valve. It is, thereby, possible to suppress or prevent contamination of a substrate by foreign matter contained in the processing liquid and to improve cleanliness of the substrate.

Further, since the supply piping and the return piping are always open, a suction force of the suction device is transmitted via the branching portion to the supply piping. The processing liquid which remains in the nozzle and the supply piping immediately after discharge of the processing liquid from the nozzle has been stopped is drawn by the suction force to the return piping and flows into the return piping (suck back). Thereby, it is possible to decrease an amount of the processing liquid remaining in the nozzle and the supply piping. As a result, it is possible to suppress or prevent occurrence of a phenomenon that droplets of the processing liquid drop intermittently from the nozzle (what is called "dripping") although discharge of the processing liquid from the nozzle is stopped.

In addition, the return piping is not opened or closed by an opening/closing valve but always open. Where the return piping is closed by the opening/closing valve on discharge of the processing liquid from the nozzle, there is a possibility that the processing liquid inside the return piping may flow backward and be supplied to the supply piping. In this case, the processing liquid which contains particles generated in the opening/closing valve is discharged from the nozzle. Therefore, such a state is maintained that the return piping is always open, thus making it possible to prevent the backward flow of the processing liquid and also to decrease an amount of foreign matter contained in the processing liquid.

It is noted that the piping is always open such that the processing liquid flows through the piping, which means that at least except for a period during which an abnormality is occurring, the processing liquid flows through the piping. If the piping is always open except for a period during which an abnormality is occurring, that is, if the valve element is always arranged at a position other than the closed position except for a period during which an abnormality is occurring, there may be disposed on the piping an opening/closing valve which makes a valve element stationary only at an open position at which a valve element is separated from a valve seat and at a closed position at which the valve element is in contact with the valve seat and a flow control valve which makes a valve element stationary at three or more positions. Therefore, at least one of the opening/closing valve and the flow control valve may be disposed on at least one of the common piping, the supply piping and the return piping.

An abnormality is a phenomenon in which, although discharge of a processing liquid from a nozzle is stopped, the processing liquid is continuously discharged from the nozzle. The common piping, the supply piping and the return piping are always open except for a period during which the above-described abnormality is occurring. Dripping, that is, a phenomenon in which, although discharge of the processing liquid from the nozzle is stopped, droplets of the processing liquid drop intermittently from the nozzle, is excluded from the abnormality. That is, such a state is maintained that the common piping, supply piping and the return piping are open on occurrence of dripping.

The suction device may be apart of the return piping or a lowering portion which extends downward from the branching portion, an aspirator which generates a suction force by utilizing the Venturi effect, a suction pump which generates a suction force by actuating a movable member such as a rotor or may be provided with two or more of them.

In the preferred embodiment, at least one of the following features may be added to the substrate processing apparatus.

The supply piping includes an elevating portion which extends upward from the branching portion, and the return piping includes a lowering portion which extends downward from the branching portion.

According to this arrangement, since the supply piping extends upward from the branching portion, the processing liquid is less likely to flow from the branching portion to the supply piping. In contrast, since the return piping extends downward from the branching portion, the processing liquid is more likely to flow from the branching portion to the return piping. The processing liquid supplied from the common piping to the branching portion tries to flow to the return piping as a result of gravity. Therefore, when discharge of the processing liquid from the nozzle is stopped, it is possible to suppress or prevent the processing liquid from flowing from the branching portion to the supply piping and being discharged from the nozzle.

The elevating portion of the supply piping may extend perpendicularly or may extend in a direction inclined obliquely in relation to a horizontal plane. Similarly, the lowering portion of the return piping may extend perpendicularly or may extend in a direction inclined obliquely in relation to the horizontal plane.

The substrate processing apparatus further includes a chamber which houses the substrate holding unit and a fluid box which is arranged laterally of the chamber. And, the branching portion is arranged inside the chamber or the fluid box.

According to this arrangement, the branching portion is arranged inside the chamber or the fluid box and brought closer to the nozzle. Therefore, the supply piping extending from the branching portion to the nozzle is shortened. Thereby, the processing liquid remaining in the supply piping is decreased in amount, thus making it possible to decrease an amount of the processing liquid remaining inside the supply piping after the processing liquid inside the supply piping has been sucked into the return piping. It is, thereby, possible to suppress or prevent occurrence of dripping.

The substrate processing apparatus further includes a temperature controller which changes a temperature of the processing liquid to be supplied to the nozzle by at least one of heating and cooling at position upstream of the supply piping.

According to this arrangement, the processing liquid supplied to the nozzle is heated or cooled upstream of the supply piping. When discharge of the processing liquid is stopped, the processing liquid is not supplied from the common piping to the supply piping but supplied from the common piping to the return piping. At this time, a temperature of the supply piping is at or near a room temperature. Therefore, immediately after discharge of the processing liquid has been started, the processing liquid consequently undergoes a temperature change in the supply piping and the nozzle.

The temperature change of the processing liquid in the supply piping can be decreased by shortening the supply piping. The branching portion is arranged inside the chamber or the fluid box and brought close to the nozzle. Therefore, the supply piping extending from the branching portion to the nozzle is shortened. It is, thereby, possible to decrease the temperature change of the processing liquid in the supply piping. Thus, it is possible to supply the processing liquid having a temperature close to an intended temperature to a substrate from the beginning.

The temperature controller may be a heater which heats the processing liquid at a temperature higher than a room temperature (for example, 20° C. to 30° C.), a cooling device which cools the processing liquid to a temperature lower than a room temperature, or may be provided with both functions of heating and cooling. Further, the temperature controller may be disposed on the common piping or disposed at a member arranged upstream of the common piping such as a tank and circulation piping.

The substrate processing apparatus further includes a narrowing device which increases a pressure loss through the return piping by decreasing a flow channel area of the return piping.

According to this arrangement, the return piping is decreased in flow channel area and increased in pressure loss thereof and, therefore, resistance is applied to the processing liquid which is to flow from the branching portion to the return piping. Therefore, if the suction device is constant in suction force, the processing liquid which flows from the branching portion to the return piping will be decreased in flow rate. Where the processing liquid inside the return piping is guided to the drain mechanism, it is possible to decrease the consumption of the processing liquid.

The narrowing device may include at least one of a contracting portion which is narrowed toward a downstream side in a flow direction of the processing liquid and an orifice member that includes at least one through hole through which the processing liquid passes. The contracting portion may be a cylindrical tapered portion with an inner diameter continuously decreasing toward a downstream side in a flow direction of the processing liquid or a cylindrical stepped portion with an inner diameter decreasing in stages toward a downstream side in a flow direction of the processing liquid or may be provided with both of the tapered portion and the stepped portion. The flow channel area means an area of a cross section orthogonal to a direction at which a liquid flows at a space where the liquid flows. The contracting portion and the orifice member are constant in flow channel area and different from the flow control valve, the aperture (flow channel area) of which is changed.

The supply piping includes an elevating portion which extends upward toward a downstream side in a flow direction of the processing liquid. And, the substrate processing apparatus includes a liquid detecting sensor for detecting whether the processing liquid is present in the elevating portion or not.

According to this arrangement, whether the processing liquid is present in the elevating portion of the supply piping or not is detected by the liquid detecting sensor. When discharge of the processing liquid is stopped, a detection position (a position at which the liquid detecting sensor detects the presence or absence of the processing liquid) inside the elevating portion is made empty. Further, when discharge of the processing liquid is executed, the elevating portion is filled with the processing liquid. After discharge of the processing liquid has been stopped, the processing liquid remaining in the elevating portion flows to the return piping due to a suction force resulting from the processing liquid flowing from the common piping to the return piping and gravity, and the detection position inside the elevating portion is made empty.

On occurrence of an abnormality that the processing liquid is supplied from the common piping to the supply piping although discharge of the processing liquid is stopped, a liquid surface of the processing liquid rises along the elevating portion to fill the elevating portion with the processing liquid. It is possible to detect the abnormality by detecting the presence or absence of the processing liquid at the elevating portion. It is also possible to confirm that the processing liquid is supplied to the supply piping when discharge of the processing liquid is executed. Further, it is possible to confirm that the supply piping is made empty after discharge of the processing liquid has been stopped.

The substrate processing apparatus further includes a controller which is configured and programmed to cause the liquid sending device to stop sending of the processing liquid when the valve element of the discharge valve is arranged at the discharge stop position and the liquid detecting sensor detects that the processing liquid is present in the elevating portion.

According to this arrangement, on occurrence of the abnormality that the processing liquid is supplied from the common piping to the supply piping although discharge of the processing liquid is stopped, the controller allows the liquid sending device to stop sending of the processing liquid. Thereby, it is possible to reliably prevent the nozzle from discharging continuously the processing liquid, although discharge of the processing liquid is stopped.

The valve actuator of the discharge valve is an electric actuator which makes the valve element stationary at any given position in a range from an open position at which the valve element is separated from the valve seat and a closed position at which the valve element is in contact with the valve seat. The discharge execution position and the discharge stop position are positions in a range from the open position to the closed position. The substrate processing apparatus further includes a controller which is configured and programmed to stop a flow of the processing liquid in the common piping by causing the electric actuator to move the valve element to the closed position when the valve element of the discharge valve is arranged at the discharge stop position and the liquid detecting sensor detects that the processing liquid is present in the elevating portion.

According to this arrangement, the discharge valve includes an electric actuator which makes the valve element stationary at a plurality of positions including the closed position, the discharge stop position and the discharge execution position. The closed position is a position at which the valve element comes into contact with the valve seat to close the inner flow channel of the discharge valve. On occurrence of the abnormality that the processing liquid is supplied from the common piping to the supply piping although discharge of the processing liquid is stopped, the controller allows the electric actuator to move the valve element to the closed position. Thereby, the supply piping is closed, thus making it possible to reliably prevent the nozzle from continuously discharging the processing liquid, although discharge of the processing liquid is stopped.

The substrate processing apparatus further includes a normally open valve which is disposed on the supply piping and always open except for a period during which an abnormality of the discharge valve is occurring, an abnormality detector which detects the abnormality of the discharge valve, and a controller which is configured and programmed to judge whether the abnormality occurs to the discharge valve or not based on a detection value of the abnormality detector and closes the normally open valve on judgment of occurrence of the abnormality.

On occurrence of the abnormality to the discharge valve, there is a case that an actual aperture of the discharge valve may be made larger than an intended aperture. For example, there is a case that, although a discharge stop command for positioning the valve element of the discharge valve at the discharge stop position is input to the discharge valve, the valve element of the discharge valve does not reach the discharge stop position. In this case, the processing liquid passes through the discharge valve at a flow rate larger than an intended flow rate. Therefore, some of the processing liquid which has passed through the discharge valve can be supplied via the branching portion and the supply piping to the nozzle and discharged from a discharge port of the nozzle.

According to this arrangement, the normally open valve is disposed on the supply piping. That is, the normally open valve is arranged between the discharge valve and the nozzle. The controller monitors the abnormality of the discharge valve based on a detection value of the abnormality detector. When the abnormality is found in the discharge valve, the controller closes the normally open valve to stop supply of the processing liquid from the supply piping to the nozzle. Therefore, even if the abnormality of the discharge valve occurs, it is possible to reliably stop discharge of the processing liquid from the nozzle.

The normally open valve may be an opening/closing valve which makes the valve element stationary only at the open position and the closed position or a flow control valve which makes the valve element stationary at three or more positions. Further, the normally open valve may be a pneumatic valve with a pneumatic actuator or an electrically operated valve with an electric actuator.

The abnormality detector may be a flowmeter which detects a flow rate of the processing liquid which flows through the common piping or the supply piping, a liquid detecting sensor which detects whether or not the processing liquid is present in the supply piping, a camera which photographs a discharge port of the nozzle, or any other device. Where the abnormality detector is a flowmeter, the abnormality detector may be arranged either upstream or downstream of the discharge valve. Where a flowmeter for detecting a flow rate of the processing liquid flowing through the common piping is attached on the common piping, the flowmeter may be used as the abnormality detector.

Another preferred embodiment of the present invention provides a substrate processing apparatus that includes a plurality of substrate holding units which hold a plurality of substrates, respectively, a plurality of nozzles which correspond to a one-to-one basis to the plurality of substrate holding units to discharge a processing liquid toward the plurality of substrates held by the plurality of substrate holding units, a liquid sending device which sends the processing liquid to be supplied to the plurality of substrates held by the plurality of substrate holding units, a plurality of common piping which correspond to a one-to-one basis to the plurality of nozzles and which are always open such that the processing liquid flows through the common piping and guide the processing liquid sent by the liquid sending device, a plurality of branching portions which are respectively connected to the plurality of common piping, a plurality of supply piping which correspond to a one-to-one basis to the plurality of common piping and which are always open such that the processing liquid flows through the supply piping and guide the processing liquid guided by the plurality of common piping from the plurality of branching portions to the plurality of nozzles, a plurality of return piping which correspond to a one-to-one basis to the plurality of common piping and which are always open such that the processing liquid flows through the return piping and guide the processing liquid guided by the plurality of common piping from the plurality of branching portions along a flow channel different from the plurality of supply piping, at least one suction device which sucks the processing liquid from the plurality of branching portions toward the plurality of return piping, a plurality of discharge valves which are disposed on the plurality of common piping respectively to change a flow rate of the processing liquid supplied from the plurality of common piping to the plurality of branching portions, a plurality of normally open valves which are disposed on the plurality of supply piping respectively and always open except for a period during which an abnormality of at least one of the plurality of discharge valves is occurring, a plurality of abnormality detectors which correspond to a one-to-one basis to the plurality of discharge valves to detect an abnormality of the plurality of discharge valves, and a controller which is configured and programmed to judge whether the abnormality occurs to at least one of the plurality of discharge valves or not based on a detection value of the plurality of abnormality detectors and closes at least one of the plurality of normally open valves upon judgment of occurrence of the abnormality.

Each of the plurality of discharge valves includes a valve body which includes an annular valve seat that surrounds an inner flow channel through which the processing liquid flows, a valve element which is arranged on the inner flow channel and which is movable with respect to the valve seat, and a valve actuator which makes the valve element stationary at a plurality of positions including a discharge execution position at which the valve element is away from the valve seat and the processing liquid is supplied from the common piping to the branching portion at a flow rate larger than a maximum value of a suction flow rate which represents a flow rate of the processing liquid which flows from the branching portion to the return piping by a suction force of the suction device and a discharge stop position at which the valve element is away from the valve seat and the processing liquid is supplied from the common piping to the branching portion at a flow rate smaller than the maximum value of the suction flow rate.

The suction device may be disposed on each of the return piping or may be connected to all the return piping. That is, the substrate processing apparatus may be provided with the plurality of suction devices so as to correspond to each of the plurality of return piping or may be provided with one suction device which is connected to each of the plurality of return piping.

According to this arrangement, the processing liquid sent from the same liquid sending device is supplied to the plurality of nozzles via the plurality of common piping, the plurality of branching portions and the plurality of supply piping. The processing liquid discharged from the plurality of nozzles is supplied to each of the plurality of substrates. Thereby, the plurality of substrates are processed by the processing liquid.

As described above, whether discharge of the processing liquid from the nozzle is executed or stopped is not switched by opening or closing the supply piping by the opening/closing valve but switched by changing an aperture of the discharge valve disposed on the common piping. Thereby, it is possible to suppress or prevent contamination of the substrate by foreign matter contained in the processing liquid.

Further, the processing liquid remaining in the nozzle and the supply piping immediately after discharge of the processing liquid from the nozzle has been stopped is drawn to the return piping by a suction force of the suction device and flows into the return piping. Thereby, it is possible to reduce an amount of the processing liquid remaining in the nozzle and the supply piping.

In addition, the return piping is not opened or closed by the opening/closing valve but always open. In a case where the return piping is closed by the opening/closing valve so as to cause the nozzle to discharge the processing liquid, there is a possibility that the processing liquid inside the return piping may flow backward and be supplied to the supply piping. Therefore, it is possible to prevent backward flow of the processing liquid and decrease an amount of foreign matter contained in the processing liquid.

The controller monitors the abnormality of the plurality of discharge valves based on detection values of the plurality of abnormality detectors. On occurrence of the abnormality to any of the discharge valves, the controller closes the normally open valve corresponding to the discharge valve to which the abnormality has occurred, thereby stopping supply of the processing liquid from the supply piping to the nozzle. Therefore, even if the abnormality occurs to the discharge valve, it is possible to reliably stop discharge of the processing liquid from the nozzle.

Further, only the normally open valve corresponding to the discharge valve to which the abnormality has occurred is closed, thereby eliminating a necessity for closing the remaining normally open valves. As a result, it is not necessary to stop discharge of the processing liquid from all the nozzles corresponding to the same liquid sending device. That is, even if the abnormity occurs to any of the discharge valves, it is possible to continue processing of a substrate. It is, thereby, possible to prevent accidental discharge of the processing liquid, with a lowering in throughput suppressed.

Still another preferred embodiment of the present invention provides a substrate processing method which includes a holding step of causing a substrate holding unit to hold a substrate, a discharge step of causing a nozzle to discharge a processing liquid toward the substrate held by the substrate holding unit, a liquid sending step of causing a liquid sending device to send the processing liquid to be supplied to the substrate held by the substrate holding unit, a first guide step of causing common piping, which is always open such that the processing liquid flows through the common piping, to guide the processing liquid sent by the liquid sending device, a second guide step of causing supply piping, which is always open such that the processing liquid flows through the supply piping, to guide the processing liquid guided by the common piping from a branching portion connected to the common piping to the nozzle, a third guide step of causing return piping, which is always open such that the processing liquid flows through the return piping, to guide the processing liquid guided by the common piping from the branching portion along a flow channel different from the supply piping, a suction step of causing a suction device to suck the processing liquid from the branching portion toward the return piping, and a flow rate changing step of causing a discharge valve, which is disposed on the common piping, to change a flow rate of the processing liquid to be supplied from the common piping to the branching portion.

The flow rate changing step includes a discharge execution step of causing a valve actuator of the discharge valve to move a valve element of the discharge valve and to locate the valve element at a discharge execution position at which the valve element is away from a valve seat of the discharge valve and the processing liquid is supplied from the common piping to the branching portion at a flow rate larger than a maximum value of a suction flow rate which represents a flow rate of the processing liquid which flows from the branching portion to the return piping by a suction force of the suction device and a discharge stop step of causing the valve actuator of the discharge valve to move the valve element of the discharge valve and to locate the valve element at a discharge stop position at which the valve element is away from the valve seat and the processing liquid is supplied from the common piping to the branching portion at a flow rate smaller than the maximum value of the suction flow rate. According to the above-described method, the effects similar to those described above can be obtained.

In the preferred embodiment, at least one of the following features may be added to the substrate processing method.

The second guide step includes a step of causing an elevating portion extending upward from the branching portion to guide the processing liquid, and the third guide step includes a step of causing a lowering portion extending downward from the branching portion to guide the processing liquid According to the above-described method, the effects similar to those described above can be obtained.

The second guide step includes a step of causing the supply piping to guide the processing liquid guided by the common piping to the nozzle from the branching portion which is arranged inside either a chamber which houses the substrate holding unit or a fluid box arranged laterally of the chamber. According to the above-described method, the effects similar to those described above can be obtained.

The substrate processing method further includes a temperature adjustment step of causing a temperature controller, which is arranged upstream of the supply piping, to change a temperature of the processing liquid to be supplied to the nozzle by at least one of heating and cooling. According to the above-described method, the effects similar to those described above can be obtained.

The substrate processing method further includes a loss increasing step of causing a narrowing device to decrease a flow channel area of the return piping and increase a pressure loss through the return piping. According to the above-described method, the effects similar to those described above can be obtained.

The second guide step includes a step of causing an elevating portion extending upward toward a downstream side in a flow direction of the processing liquid. And, the substrate processing method further includes a liquid detection step of causing a liquid detecting sensor to detect whether the processing liquid is present in the elevating portion or not. According to the above-described method, the effects similar to those described above can be obtained.

The substrate processing method further includes liquid sending stop step of causing the liquid sending device to stop of sending of the processing liquid when the valve element of the discharge valve is arranged at the discharge stop position and the liquid detecting sensor detects that the processing liquid is present in the elevating portion. According to the above-described method, the effects similar to those described above can be obtained.

The substrate processing method further includes liquid sending stop step of stopping a flow of the processing liquid in the common piping by causing the electric actuator of the discharge valve to move the valve element of the discharge valve to a closed position at which the valve element is in contact with the valve seat of the discharge valve when the valve element is arranged at the discharge stop position and the liquid detecting sensor detects that the processing liquid is present in the elevating portion. According to the above-described method, the effects similar to those described above can be obtained.

The substrate processing method further includes an abnormality detection step of causing an abnormality detector to detect an abnormality of the discharge valve and a valve closing step of causing a normally open valve, which is disposed on the supply piping and always open except for a period during which the abnormality of the discharge valve is occurring, to close when the abnormality occurs. According to the above-described method, the effects similar to those described above can be obtained.

Still another preferred embodiment of the present invention provides a substrate processing method which includes a holding step of causing a plurality of substrate holding units to hold a plurality of substrates, respectively, a discharge step of causing a plurality of nozzles, which correspond to a one-to-one basis to the plurality of substrate holding units, to discharge the processing liquid toward the plurality of substrates held by the plurality of substrate holding units, a liquid sending step of causing a liquid sending device to send the processing liquid to be supplied to the plurality of substrates held by the plurality of substrate holding units, a first guide step of causing a plurality of common piping, which correspond to a one-to-one basis to the plurality of nozzles and which are always open such that the processing liquid flows through the plurality of common piping, to guide the processing liquid sent by the liquid sending device, a second guide step of causing a plurality of supply piping, which correspond to a one-to-one basis to the plurality of common piping and which are always open such that the processing liquid flows through the plurality of supply piping, to guide the processing liquid guided by the plurality of common piping from a plurality of branching portions respectively connected to the plurality of common piping to the plurality of nozzles, a third guide step of causing a plurality of return piping, which correspond to a one-to-one basis to the plurality of common piping and which are always open such that the processing liquid flows through the plurality of return piping, to guide the processing liquid guided by the plurality of common piping from the plurality of branching portions along a flow channel different from the plurality of supply piping, a suction step of causing at least one suction device to suck the processing liquid from the plurality of branching portions toward the plurality of return piping, a flow rate changing step of causing a plurality of discharge valves, which are disposed on the plurality of common piping respectively, to change a flow rate of the processing liquid to be supplied from the plurality of common piping to the plurality of branching portions, an abnormality detection step of causing a plurality abnormality detectors, which correspond to a one-to-one basis to the plurality of discharge valves, to detect an abnormality of the plurality of discharge valves, and a valve closing step of causing at least one of a plurality of normally open valves, which are disposed on the plurality of supply piping respectively and which are always open except for a period during which the abnormality of at least one of the plurality of discharge valves is occurring, to close when the abnormality of the at least one of the plurality of discharge valves occurs.

The flow rate changing step includes a discharge execution step of causing a valve actuator of the discharge valve to move a valve element of the discharge valve and to locate the valve element at a discharge execution position at which the valve element is away from a valve seat of the discharge valve and the processing liquid is supplied from the common piping to the branching portion at a flow rate larger than a maximum value of a suction flow rate which represents a flow rate of the processing liquid which flows from the branching portion to the return piping by a suction force of the suction device and a discharge stop step of causing the valve actuator of the discharge valve to move the valve element of the discharge valve and to locate the valve element at a discharge stop position at which the valve element is away from the valve seat and the processing liquid is supplied from the common piping to the branching portion at a flow rate smaller than the maximum value of the suction flow rate. According to the above-described method, the effects similar to those described above can be obtained.

The above and other objects, features, and effects of the present invention will become more apparent from the following detailed description of the preferred embodiments with reference to the attached drawings.

DETAILED DESCRIPTION OF PREFERRED EMBODIMENTS

Figure 1:
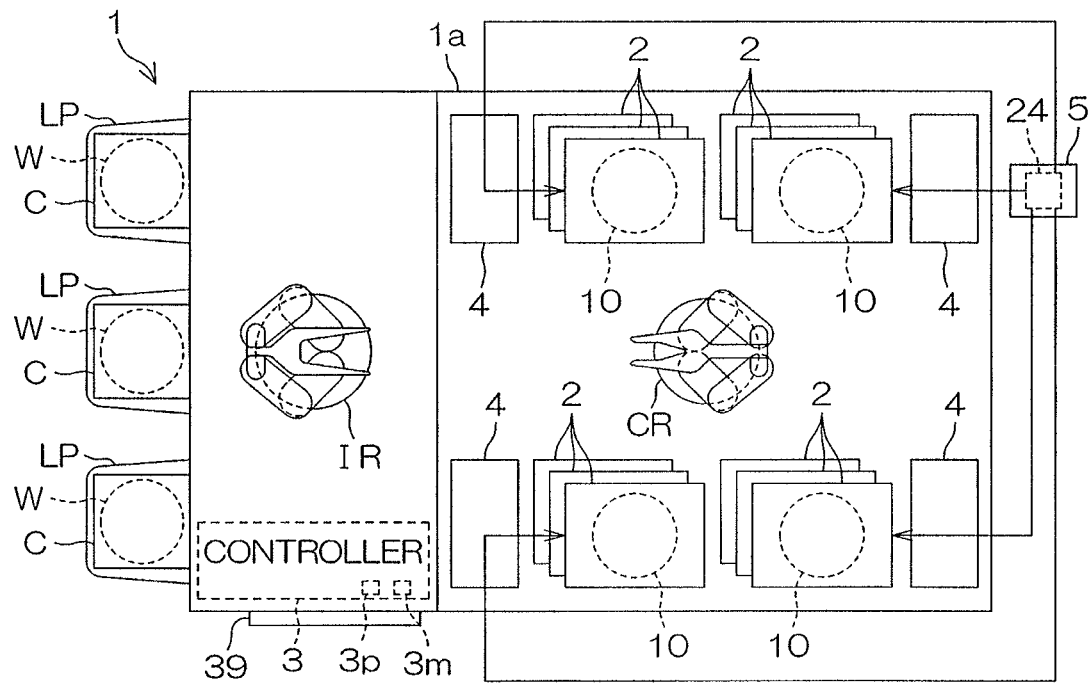
FIG. 1 is a schematic view which shows a substrate processing apparatus according to a first preferred embodiment of the present invention, when viewed from above.

FIG. 1 is a schematic view which shows a substrate processing apparatus 1 according to the first preferred embodiment of the present invention, when viewed from above.

The substrate processing apparatus 1 is a single substrate processing type apparatus which processes circular-plate shaped substrates W such as semiconductor wafers one at a time. The substrate processing apparatus 1 includes a plurality of load ports which hold a plurality of carriers C that house substrates W, a plurality of processing units 2 which process the substrates W transferred from the plurality of load ports by using a processing fluid such as a processing liquid or a processing gas, and a controller 3 that controls the substrate processing apparatus 1. The controller 3 is a computer which includes a storage portion that stores information such as programs and an arithmetic portion that controls the substrate processing apparatus 1 according to the information stored at the storage portion.

The substrate processing apparatus 1 further includes a transfer robot which transfers a substrate W between the load port and the processing unit 2. The transfer robot includes an indexer robot IR and a center robot CR. The indexer robot IR transfers the substrate W between the load port and the center robot CR. The center robot CR transfers the substrate W between the indexer robot IR and the processing unit 2. The indexer robot IR and the center robot CR include a hand which supports the substrate W.

The substrate processing apparatus 1 includes a plurality of (for example, four) fluid boxes 4, each of which houses a fluid device such as a first discharge valve 34A which will be described later. The processing unit 2 and the fluid box 4 are arranged inside an outer wall 1a of the substrate processing apparatus 1 and covered with the outer wall 1a of the substrate processing apparatus 1. A chemical liquid cabinet 5 which houses a tank 24, etc., which will be described later is arranged outside the outer wall 1a of the substrate processing apparatus 1. The chemical liquid cabinet 5 may be arranged laterally of the substrate processing apparatus 1 or may be arranged below a clean room in which the substrate processing apparatus 1 is installed (underground).

The plurality of processing units 2 form a plurality of (for example, four) towers arranged so as to surround the center robot CR in a plan view. Each of the towers includes the plurality of (for example, three) processing units 2 which are stacked vertically. The four fluid boxes 4 correspond individually to the four towers. A chemical liquid inside the chemical liquid cabinet 5 is supplied via any of the fluid boxes to all the processing units 2 included in the tower corresponding to these fluid boxes 4.

Figure 2:
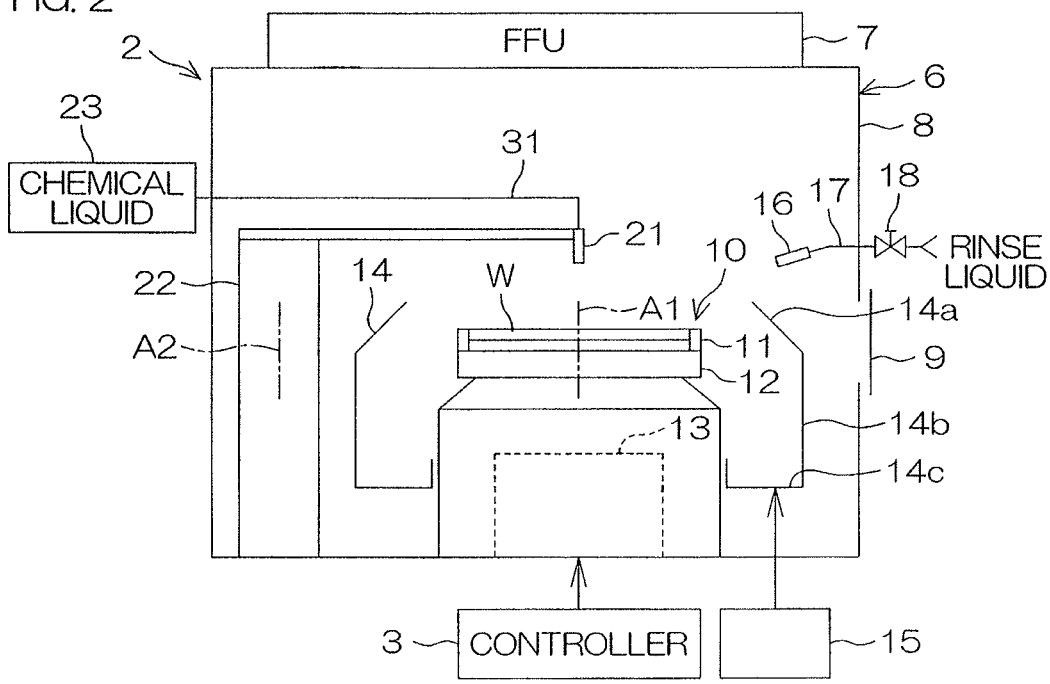
FIG. 2 is a schematic view which shows an interior of a processing unit when viewed horizontally.

FIG. 2 is a schematic view which shows an interior of the processing unit 2 when viewed horizontally.

The processing unit 2 includes a box-shaped chamber 6 which has an inner space, a spin chuck 10 which rotates a substrate W around a perpendicular rotation axis A1 passing through a central portion of the substrate W while horizontally holding the substrate W inside the chamber 6, and a cylindrical cup 14 which receives a processing liquid expelled from the substrate W. The spin chuck 10 is one example of the substrate holding unit.

The chamber 6 includes a box-shaped partition wall 8 on which a carry-in/carry-out port through which the substrate W passes is disposed, a shutter 9 which opens and closes the carry-in/carry-out port and an FFU 7 (fan filter unit) which produces a downflow of clean air which is air filtered by the filter inside the chamber 6. The center robot CR carries the substrate W in the chamber 6 through the carry-in/carry-out port and carries out the substrate W from the chamber 6 through the carry-in/carry-out port.

The spin chuck 10 includes a circular-plate shaped spin base 12 which is held in a horizontal posture, a plurality of chuck pins 11 which hold the substrate W in a horizontal posture above the spin base 12, and a spin motor 13 which rotates the substrate W around the rotation axis A1 by rotating the plurality of chuck pins 11. The spin chuck 10 is not limited to a clamping type chuck which allows the plurality of chuck pins 11 to be in contact with an outer circumferential surface of the substrate W but may be a vacuum type chuck which horizontally holds the substrate W by allowing a rear surface (lower surface) of the substrate W which is a non-device forming surface to adhere on an upper surface of the spin base 12.

The cup 14 includes a cylindrical inclined portion 14a which extends obliquely upward toward the rotation axis A1, a circular cylindrical guide portion 14b which extends downward from a lower end portion (outer end portion) of the inclined portion 14a, and a liquid receiving portion 14c which forms an annular groove opened upwardly. The inclined portion 14a includes a circular annular upper end which is larger in inner diameter than the substrate W and the spin base 12. An upper end of the inclined portion 14a corresponds to an upper end of the cup 14. The upper end of the cup 14 surrounds the substrate W and the spin base 12 in a plan view.

The processing unit 2 includes a cup elevating/lowering unit 15 which elevates and lowers the cup 14 perpendicularly between an upper position (the position shown in FIG. 2) at which the upper end of the cup 14 is positioned above a holding position at which the spin chuck 10 holds the substrate W and a lower position at which the upper end of the cup 14 is positioned below from the holding position. When the processing liquid is supplied to the substrate W, the cup 14 is arranged at the upper position. The processing liquid scattered outward from the substrate W is received by the inclined portion 14a and, thereafter, collected by the guide portion 14b into the liquid receiving portion 14c.

The processing unit 2 includes a rinse liquid nozzle 16 which discharges downward a rinse liquid to an upper surface of the substrate W held by the spin chuck 10. The rinse liquid nozzle 16 is connected to rinse liquid piping 17 on which a rinse liquid valve 18 is disposed. The processing unit 2 may be provided with a nozzle movement unit which horizontally moves the rinse liquid nozzle 16 between a processing position at which the rinse liquid discharged from the rinse liquid nozzle 16 is supplied to the substrate W and a retracted position at which the rinse liquid nozzle 16 is separated from the substrate W in a plan view.

When the rinse liquid valve 18 is opened, the rinse liquid is supplied from the rinse liquid piping 17 to the rinse liquid nozzle 16 and discharged from the rinse liquid nozzle 16. The rinse liquid is, for example, pure water (deionized water). The rinse liquid is not limited to pure water but may be any one of carbonated water, electrolytic ion water, hydrogen water, ozone water and hydrochloric acid water with a diluted concentration (for example, approximately 10 to 100 ppm).

The processing unit 2 includes a chemical liquid nozzle 21 which discharges downward a chemical liquid to the upper surface of the substrate W held by the spin chuck 10 and a nozzle movement unit 22 which horizontally moves the chemical liquid nozzle 21 between a processing position at which the chemical liquid discharged from the chemical liquid nozzle 21 is supplied to the upper surface of the substrate W and a retracted position at which the chemical liquid nozzle 21 is separated from the substrate W in a plan view. The nozzle movement unit 22 is, for example, a turning unit which horizontally moves the chemical liquid nozzle 21 around an oscillation axis A2 extending perpendicularly around the cup 14.

The substrate processing apparatus 1 includes a chemical liquid supplying device 23 which supplies a chemical liquid to the chemical liquid nozzle 21. The chemical liquid supplying device 23 will be described later. The chemical liquid supplied to the chemical liquid nozzle 21 is a liquid which includes at least any one of sulfuric acid, acetic acid, nitric acid, hydrochloric acid, hydrofluoric acid, phosphoric acid, acetic acid, ammonia water, hydrogen peroxide water, an organic acid (for example, citric acid, oxalic acid, etc.) an organic alkali (for example, TMAH: tetramethylammonium hydroxide, etc.), a surfactant and a corrosion inhibitor. A liquid other than the above-described liquids may be supplied to the chemical liquid nozzle 21.

Figure 3:
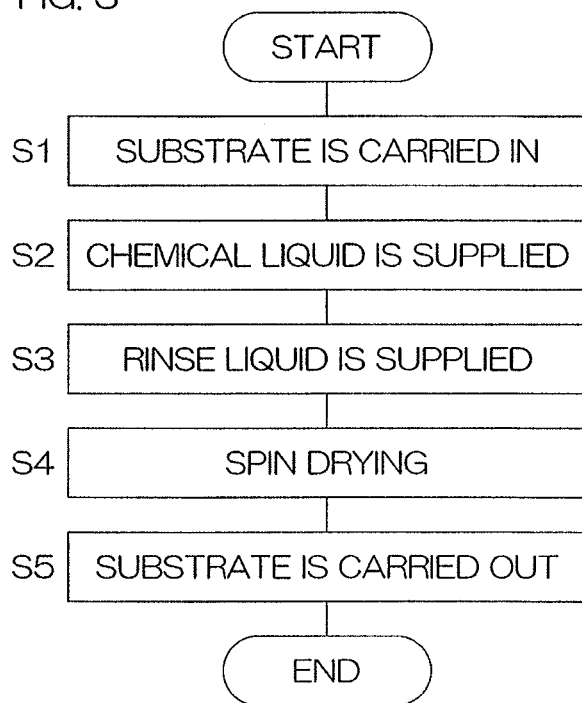
FIG. 3 is a process drawing for describing one example of substrate processing executed by the substrate processing apparatus.

FIG. 3 is a process drawing for describing one example of processing of the substrate W which is executed by the substrate processing apparatus 1. The controller 3 controls the substrate processing apparatus 1 to execute each of the following processes. In other words, the controller 3 is programmed so as to execute each of the following processes. Hereinafter, FIG. 1 to FIG. 3 will be referred to.

When the substrate W is processed by the substrate processing apparatus 1, there is performed a carry-in process in which the substrate W is carried into the chamber 6 (Step S1 in FIG. 3).

Specifically, in a state where the chemical liquid nozzle 21 is retracted from above the substrate W and the cup 14 is positioned at the lower position, the center robot CR (refer to FIG. 1) allows the hand to advance into the chamber 6, while supporting the substrate W with the hand. Thereafter, the center robot CR places the substrate W on the hand onto the spin chuck 10, with the front surface of the substrate W pointed above. After the substrate W is held by the chuck pin 11, the spin motor 13 starts rotation of the substrate W. The center robot CR allows the hand to retract from the interior of the chamber 6, after the substrate W has been placed on the spin chuck 10.

Next, there is performed a chemical liquid supplying process in which the chemical liquid is supplied to the substrate W (Step S2 in FIG. 3).

Specifically, the nozzle movement unit 22 moves the chemical liquid nozzle 21 to the processing position, and the cup elevating/lowering unit 15 elevates the cup 14 up to the upper position. Thereafter, the chemical liquid supplying device 23 starts to supply the chemical liquid to the chemical liquid nozzle 21, and the chemical liquid nozzle 21 discharges the chemical liquid. When the chemical liquid nozzle 21 discharges the chemical liquid, the nozzle movement unit 22 may move the chemical liquid nozzle 21 between a central processing position at which the chemical liquid discharged from the chemical liquid nozzle 21 lands on a central portion of the upper surface of the substrate W and an outer circumferential processing position at which the chemical liquid discharged from the chemical liquid nozzle 21 lands on an outer circumferential portion of the upper surface of the substrate W or may make the chemical liquid nozzle 21 stationary so that a position on which the chemical liquid lands is at the central portion of the upper surface of the substrate W.

The chemical liquid discharged from the chemical liquid nozzle 21 lands on the upper surface of the substrate W and, thereafter, flows outward along the upper surface of the rotating substrate W. Thereby, a liquid film which covers an entire area of the upper surface of the substrate W is formed by the chemical liquid, and the chemical liquid is supplied to an entire area of the upper surface of the substrate W. In particular, where the nozzle movement unit 22 moves the chemical liquid nozzle 21 between the central processing position and the outer circumferential processing position, the entire area of the upper surface of the substrate W is scanned at a position on which the chemical liquid lands. Therefore, the chemical liquid is supplied uniformly to an entire area of the upper surface of the substrate W. Thereby, the upper surface of the substrate W is uniformly processed. After the elapse of a predetermined period of time from start of supply of the chemical liquid to the chemical liquid nozzle 21, supply of the chemical liquid to the chemical liquid nozzle 21 is stopped. Thereafter, the nozzle movement unit 22 moves the chemical liquid nozzle 21 to the retracted position.

Next, there is performed a rinse liquid supplying process in which pure water that is one example of the rinse liquid is supplied to the upper surface of the substrate W (Step S3 in FIG. 3).

Specifically, the rinse liquid valve 18 is opened, and the rinse liquid nozzle 16 starts to discharge pure water. The pure water landing on the upper surface of the substrate W flows outward along the upper surface of the rotating substrate W. The chemical liquid on the substrate W is washed away by the pure water discharged from the rinse liquid nozzle 16. Thereby, a liquid film of pure water is formed so as to cover an entire area of the upper surface of the substrate W. After the elapse of a predetermined period of time from when the rinse liquid valve 18 is opened, the rinse liquid valve 18 is closed to stop discharge of the pure water.

Next, there is performed a drying process in which the substrate W is dried by rotation of the substrate W (Step S4 in FIG. 3).

Specifically, the spin motor 13 accelerates rotation of the substrate W in a rotation direction, thereby rotating the substrate W at a high rotation speed (for example, several thousand rotations per minute) which is higher than a rotation speed of the substrate W in the chemical liquid supplying process and the rinse liquid supplying process. Thereby, the liquid is removed from the substrate W to dry the substrate W. After the elapse of a predetermined period of time from start of high speed rotation of the substrate W, the spin motor 13 stops rotating. Thereby, rotation of the substrate W is stopped.

Next, there is performed a carry-out process in which the substrate W is carried out from the chamber 6 (Step S5 in FIG. 3).

Specifically, the cup elevating/lowering unit 15 lowers the cup 14 to the lower position. Thereafter, the center robot CR (refer to FIG. 1) allows the hand to advance into the chamber 6. After release of the substrate W held by the plurality of chuck pins 11, the center robot CR supports the substrate W on the spin chuck 10 with the hand. Thereafter, the center robot CR allows the hand to retract from the interior of the chamber 6, while supporting the substrate W with the hand. Thereby, the substrate W which has been processed is carried out from the chamber 6. The above described sequence is repeated and therefore a plurality of substrates W carried in the substrate processing apparatus are processed one at a time.

Figure 4:
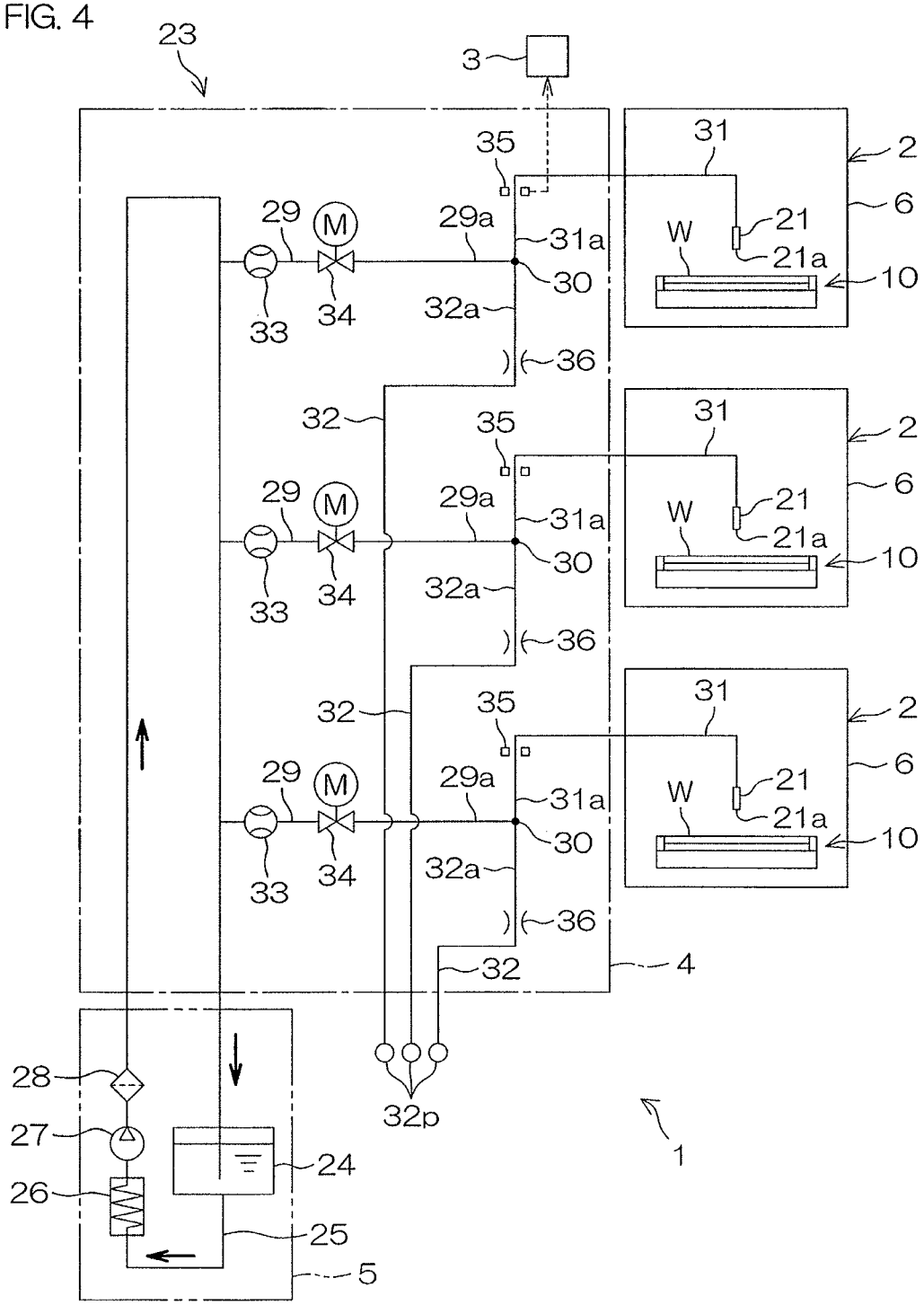
FIG. 4 is a schematic view which shows a chemical liquid supplying device according to the first preferred embodiment of the present invention.

FIG. 4 is a schematic view which shows the chemical liquid supplying device 23 according to the first preferred embodiment of the present invention. In FIG. 4, the fluid box 4 is shown by the single dotted and dashed line, and the chemical liquid cabinet 5 is shown by the double dotted and dashed line. This is also applicable to FIG. 9, FIG. 10, FIG. 12, FIG. 13 and FIG. 15 which will be described later. Members arranged in a region surrounded by the single dotted and dashed line are arranged inside the fluid box 4, and members arranged in a region surrounded by the double dotted and dashed line are arranged inside the chemical liquid cabinet 5.

The substrate processing apparatus 1 includes the plurality of chemical liquid supplying devices 23 individually corresponding to the plurality of towers formed by the plurality of processing units 2. The chemical liquid supplying device 23 supplies the chemical liquid to all the processing units 2 included in the same tower. FIG. 4 shows one chemical liquid supplying device 23 and three processing units 2 corresponding to this chemical liquid supplying device 23.

The chemical liquid supplying device 23 includes a supply tank 24 which stores the chemical liquid to be supplied to the substrate W, and circulation piping 25 which forms an annular circulation flow channel for circulating the chemical liquid inside the supply tank 24. The chemical liquid supplying device 23 further includes a circulation pump 27 which sends the chemical liquid inside the supply tank 24 to the circulation piping 25, a circulation filter 28 which removes foreign matter such as particles from the chemical liquid and a circulation heater 26 which adjusts a temperature of the chemical liquid by heating the chemical liquid inside the supply tank 24. The circulation pump 27, the circulation filter 28 and the circulation heater 26 are interposed in the circulation piping 25.

The circulation pump 27 always feeds the chemical liquid inside the supply tank 24 to the circulation piping 25. The chemical liquid supplying device 23 may be provided, in place of the circulation pump 27, with a pressure device by which an atmospheric pressure inside the supply tank 24 is raised to push out the chemical liquid inside the supply tank 24 to the circulation piping 25. Any of the circulation pump 27 and the pressure device is each one example of the liquid sending device which sends the chemical liquid inside the supply tank 24 to the circulation piping 25.

Upstream and downstream ends of the circulation piping 25 are connected to the supply tank 24. The chemical liquid is sent from the supply tank 24 to the upstream end of the circulation piping 25 and returned from the downstream end of the circulation piping 25 to the supply tank 24. Thereby, the chemical liquid inside the supply tank 24 is circulated through the circulation flow channel. During circulation of the chemical liquid through the circulation flow channel, foreign matter contained in the chemical liquid is removed by the circulation filter 28, and the chemical liquid is heated by the circulation heater 26. Thereby, the chemical liquid inside the supply tank 24 is maintained at a constant temperature higher than a room temperature.

The chemical liquid supplying device 23 includes a plurality of sets, each of which is composed of common piping 29, a branching portion 30, supply piping 31 and return piping 32, so as to individually correspond to the plurality of processing units 2. The common piping 29, the supply piping 31 and the return piping 32 may be mutually equal in inner diameter or may be different from each other. An upstream end of the common piping 29 is connected to the circulation piping 25 and a downstream end of the common piping 29 is connected to the branching portion 30. An upstream end of the supply piping 31 is connected to the branching portion 30 and a downstream end of the supply piping 31 is connected to the chemical liquid nozzle 21. An upstream end of the return piping 32 is connected to the branching portion 30. An exhaust port 32$p$ disposed at a downstream end of the return piping 32 is arranged below from the branching portion 30. The chemical liquid inside the return piping 32 is expelled from the exhaust port 32$p$ outside from the return piping 32.

The chemical liquid which flows through the circulation piping 25 flows from the circulation piping 25 to the common piping 29 and is supplied from the common piping 29 to the branching portion 30. The chemical liquid supplied from the branching portion 30 to the supply piping 31 is discharged from the chemical liquid nozzle 21 and supplied to the substrate W. Thereby, the substrate W is processed. On the other hand, the chemical liquid supplied from the branching portion 30 to the return piping 32 is expelled from the exhaust port 32$p$ of the return piping 32. The chemical liquid expelled from the return piping 32 is expelled by a drain mechanism or collected by a recovery mechanism.

The chemical liquid supplying device 23 includes a plurality of sets, each of which is composed of a flowmeter 33, a discharge valve 34, a liquid detecting sensor 35, and a narrowing device 36, so as to individually correspond to the plurality of processing units 2. The flowmeter 33 and the discharge valve 34 are attached to the common piping 29. The liquid detecting sensor 35 is attached to the supply piping 31. The narrowing device 36 is attached to the return piping 32. The flowmeter 33 detects a flow rate (an amount of the chemical liquid passing through the flowmeter 22 for a unit time) of the chemical liquid which flows through the common piping 29. The discharge valve 34 changes a flow rate of the chemical liquid supplied from the common piping 29 to the branching portion 30. The liquid detecting sensor 35 detects whether the chemical liquid is present in a detection position inside the supply piping 31 or not. The liquid detecting sensor 35 is, for example, a capacitance sensor. The narrowing device 36 decreases a flow channel area of the return piping 32, thereby increasing a pressure loss through the return piping 32.

The common piping 29 includes a horizontal portion 29$a$ which extends horizontally to the branching portion 30. The supply piping 31 includes an elevating portion 31$a$ which extends upward from the branching portion 30. The return piping 32 includes a lowering portion 32$a$ which extends downward from the branching portion 30. The lowering portion 32$a$ is one example of the suction device which allows the chemical liquid to drop from the branching portion 30 to the return piping 32. The lowering portion 32$a$ extends downward toward a downstream flow of the chemical liquid in the return piping 32. The elevating portion 31a extends upward toward a downstream flow of the chemical liquid in the supply piping 31. The liquid detecting sensor 35 is attached to the elevating portion 31a. An upper end portion of the elevating portion 31a is arranged above from the liquid detecting sensor 35.

Figure 5:
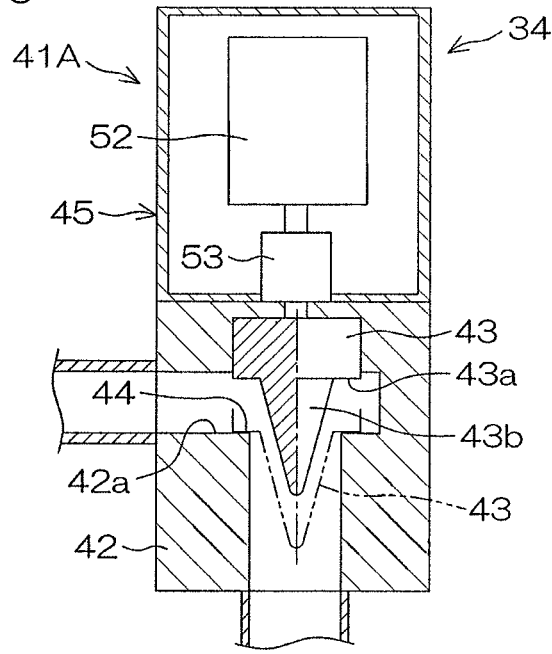
FIG. 5 is a schematic cross sectional view which shows a perpendicular cross section of a flow control valve.

FIG. 5 is a schematic cross sectional view which shows a perpendicular cross section of a flow control valve 41A. The discharge valve 34 is the flow control valve 41A shown in FIG. 5. The flow control valve 41A shown in FIG. 5 is a needle valve. The flow control valve 41A may include any other type.

The flow control valve 41A includes a valve body 42 which forms an inner flow channel 42a through which the chemical liquid flows and a valve element 43 which is arranged inside the inner flow channel 42a. In the example shown in FIG. 5, the valve element 43 is a needle. The valve element 43 includes an annular portion 43a which is in contact with an annular valve seat 44 disposed on the inner flow channel 42a and a conical portion 43b which is coaxial to the valve seat 44. The flow control valve 41A further includes a valve actuator 45 which moves the valve element 43 between a fully opened position (the position shown by the solid line in FIG. 5) and a closed position (the position shown by the double dotted and dashed line in FIG. 5).

The valve actuator 45 makes the valve element 43 stationary at any given position in a range from the fully opened position to the closed position. The fully opened position is a position at which the valve element 43 moves away from the valve seat 44. The closed position is a position at which the valve element 43 is in contact with the valve seat 44 to close the inner flow channel 42a. The fully opened position is a position at which the flow control valve 41A has a maximum aperture. The closed position is a position at which the flow control valve 41A has a minimum (zero) aperture.

A movable range from the fully opened position to the closed position includes a high flow rate position and a low flow rate position. The high flow rate position and the low flow rate position are each an open position at which the valve element 43 is separated from the valve seat 44. The flow control valve 41A when the valve element 43 is arranged at the high flow rate position is larger in aperture than the flow control valve 41A when the valve element 43 is arranged at the low flow rate position. The high flow rate position may be the fully opened position. The low flow rate position is a slow leak position at which the chemical liquid passes through the flow control valve 41A at a low flow rate.

The valve actuator 45 shown in FIG. 5 is, for example, an electric actuator which electrically actuates the valve element 43. The valve actuator 45 includes an electric motor 52 which generates a force for moving the valve element 43 in an axial direction of the valve element 43 and a motion conversion mechanism 53 which converts rotation of the electric motor 52 to linear motion of the valve element 43 in an axial direction of the valve element 43. The valve element 43 moves in the axial direction of the valve element 43 according to rotation of the electric motor 52. The electric motor 52 is controlled for a rotation angle by the controller 3.

When the electric motor 52 rotates forward, the annular portion 43a of the valve element 43 comes close to the valve seat 44. When the electric motor 52 rotates reversely, the annular portion 43a of the valve element 43 moves away from the valve seat 44. An annular space between the conical portion 43b of the valve element 43 and the valve seat 44 is increased or decreased in area in association with movement of the valve element 43. Thereby, the flow control valve 41A is changed in aperture. Further, the valve element 43 is arranged at the closed position, and the annular portion 43a of the valve element 43 is pressed to the valve seat 44, by which the inner flow channel 42a is closed to close the flow control valve 41A.

Figure 6:
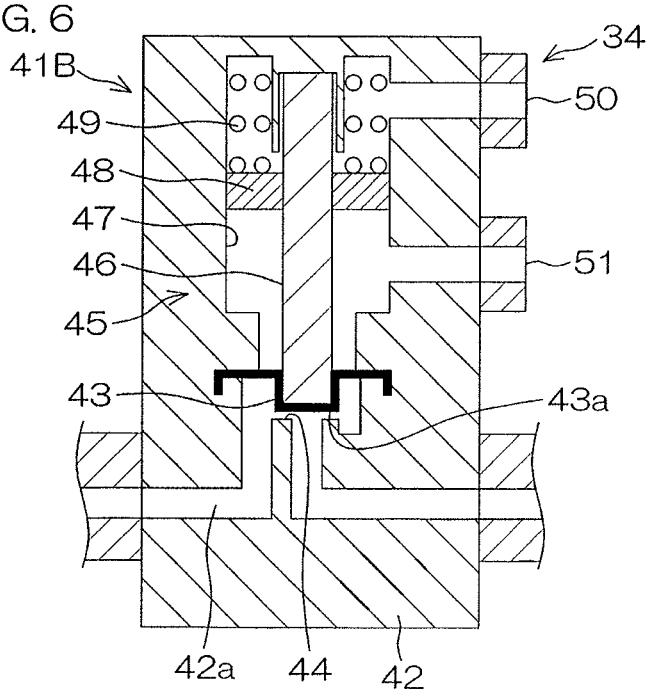
FIG. 6 is a schematic cross sectional view which shows a perpendicular cross section of an opening/closing valve.

FIG. 6 is a schematic cross sectional view which shows a perpendicular cross section of an opening/closing valve 41B. The discharge valve 34 may be the opening/closing valve 41B shown in FIG. 6. The opening/closing valve 41B is, for example, a diaphragm valve. The opening/closing valve 41B includes any other type.

The opening/closing valve 41B includes a valve body 42 which forms an inner flow channel 42a through which the chemical liquid flows and a valve element 43 which is arranged inside the inner flow channel 42a. In the example shown in FIG. 6, the valve element 43 is a diaphragm. The valve element 43 includes an annular portion 43a which opposes the annular valve seat 44 disposed on the inner flow channel 42a. The opening/closing valve 41B further includes a valve actuator 45 which moves the valve element 43 between the high flow rate position and the low flow rate position (the position shown by the solid line in FIG. 6). The high flow rate position is a fully opened position at which the opening/closing valve 41B has a maximum aperture.

The valve actuator 45 shown in FIG. 6 is, for example, a pneumatic actuator which actuates the valve element 43 by air pressure. The valve actuator 45 includes a rod 46 which moves together with the valve element 43, a cylinder 47 which surrounds the rod 46 and a piston 48 which divides the interior of the cylinder 47 into a first chamber and a second chamber. The valve actuator 45 further includes a spring 49 which generates a force for moving the rod 46 and the valve element 43 to the closed position by pushing the piston 48 to the valve element 43, a first port 51 which is connected to the first chamber, and a second port 51 which is connected to the second chamber. The spring 49 is arranged in the first chamber.

The valve element 43 is pressed to the valve seat 44 by the force of the spring 49. Air pressure is supplied to raise an atmospheric pressure of the second chamber higher than an atmospheric pressure of the first chamber, by which the piston 48 moves to the first chamber, that is, in a direction of moving away from the valve element 43. Thereby, the valve element 43 moves away from the valve seat 44 to increase an aperture of the opening/closing valve 41B. When the second chamber is lowered in atmospheric pressure, the piston 48 returns toward the valve element 43 by a force of the spring 49. Thereby, the valve element 43 returns to the low flow rate position, decreasing an aperture of the opening/closing valve 41B.

The chemical liquid is sent to the chemical liquid nozzle 21 by a supply pressure of the circulation pump 27. A pulsation which varies supply pressure occurs depending on a mode of the circulation pump 27. In this case, the chemical liquid discharged from the chemical liquid nozzle 21 can be varied in flow rate. Where the discharge valve 34 is the flow control valve 41A shown in FIG. 5, the discharge valve 34 is changed in aperture depending on pulsation of the circulation pump 27, thus making it possible to reduce a variation in flow rate of the chemical liquid supplied to the chemical liquid nozzle 21. Where the flow control valve 41A is not disposed on the common piping 29 but, for example, disposed on the return piping 32, the above-described effect is not obtained or the effect is lowered. Therefore, the discharge valve 34 is disposed on the common piping 29, by which the chemical liquid discharged from the chemical liquid nozzle 21 can be made stable in flow rate.

Figure 7:
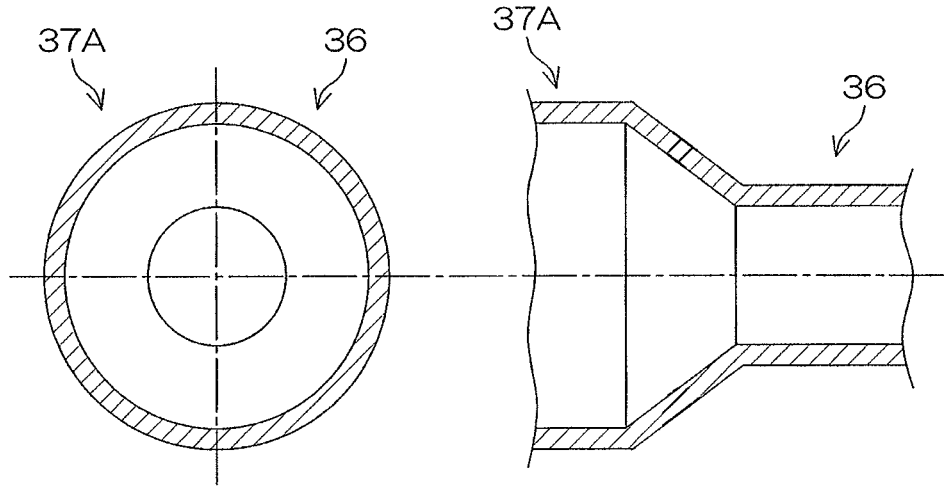
FIG. 7 is a schematic cross sectional view which shows a cross section of a contracting portion. On the left side of FIG. 7, there is shown a cross section which is orthogonal to a direction at which a chemical liquid flows. On the right side of FIG. 7, there is shown a cross section which is along a cut plane including a center line of the contracting portion.
Figure 8:
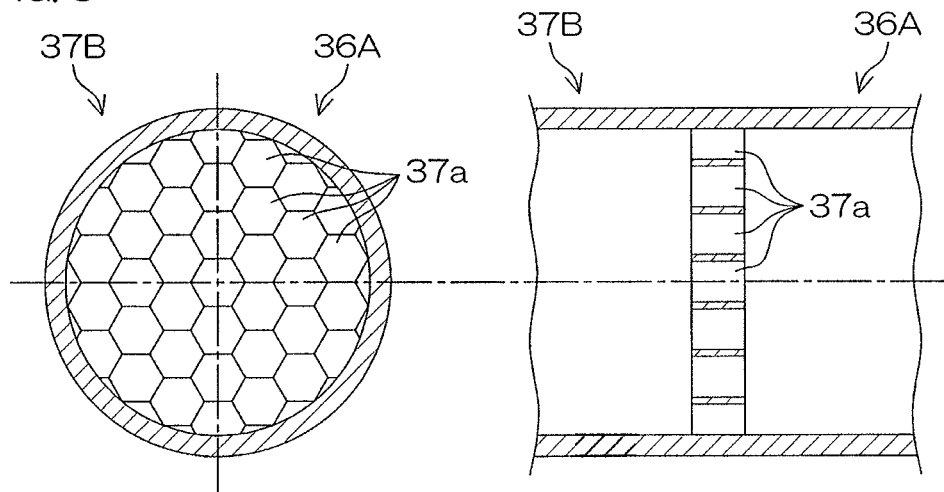
FIG. 8 is a schematic cross sectional view which shows a cross section of an orifice member. On the left side of FIG. 8, there is shown a drawing in which the orifice member is viewed in a direction at which the chemical liquid flows. On the right side of FIG. 8, there is shown a cross section which is along a cut plane including a center line of the orifice member.

FIG. 7 is a schematic cross sectional view which shows a cross section of the contracting portion 37A. On the left side of FIG. 7, there is shown a cross section orthogonal to a direction at which the chemical liquid flows, and on the right side of FIG. 7, there is shown a cross section which is along a cut plane including a center line of the contracting portion 37A. FIG. 8 is a schematic cross sectional view which shows a cross section of the orifice member 37B. On the left side of FIG. 8, there is shown a drawing in which the orifice member 37B is viewed in a direction at which the chemical liquid flows. On the right side of FIG. 8, there is shown a cross section which is along a cut plane including a center line of the orifice member 37B.

The narrowing device 36 may be the contracting portion 37A shown in FIG. 7 or the orifice member 37B shown in FIG. 8. The contracting portion 37A shown in FIG. 7 is continuously narrowed in inner diameter toward a downstream flow of the chemical liquid in the supply piping 31. The contracting portion 37A may be narrowed in inner diameter in stages. The orifice member 37B shown in FIG. 5 includes one or more through holes 37a which penetrate through the orifice member 37B in a thickness direction of the orifice member 37B, that is, in a direction at which the chemical liquid flows. FIG. 5 shows an example in which the plurality of through holes 37a are disposed on the orifice member 37B and the through hole 37a is in the shape of hexagon when viewed in a direction at which the chemical liquid flows.

The plurality of narrowing devices 36 are individually disposed on the plurality of return piping 32. The narrowing device 36 decreases a flow channel area of the return piping 32, thereby increasing a pressure loss through the return piping 32. The narrowing device 36 decreases the flow channel area of the return piping 32 but does not completely close the return piping 32. Therefore, the chemical liquid is able to always pass through the narrowing device 36. A pressure loss through the return piping 32 is larger than a pressure loss through the supply piping 31.

Figure 9:
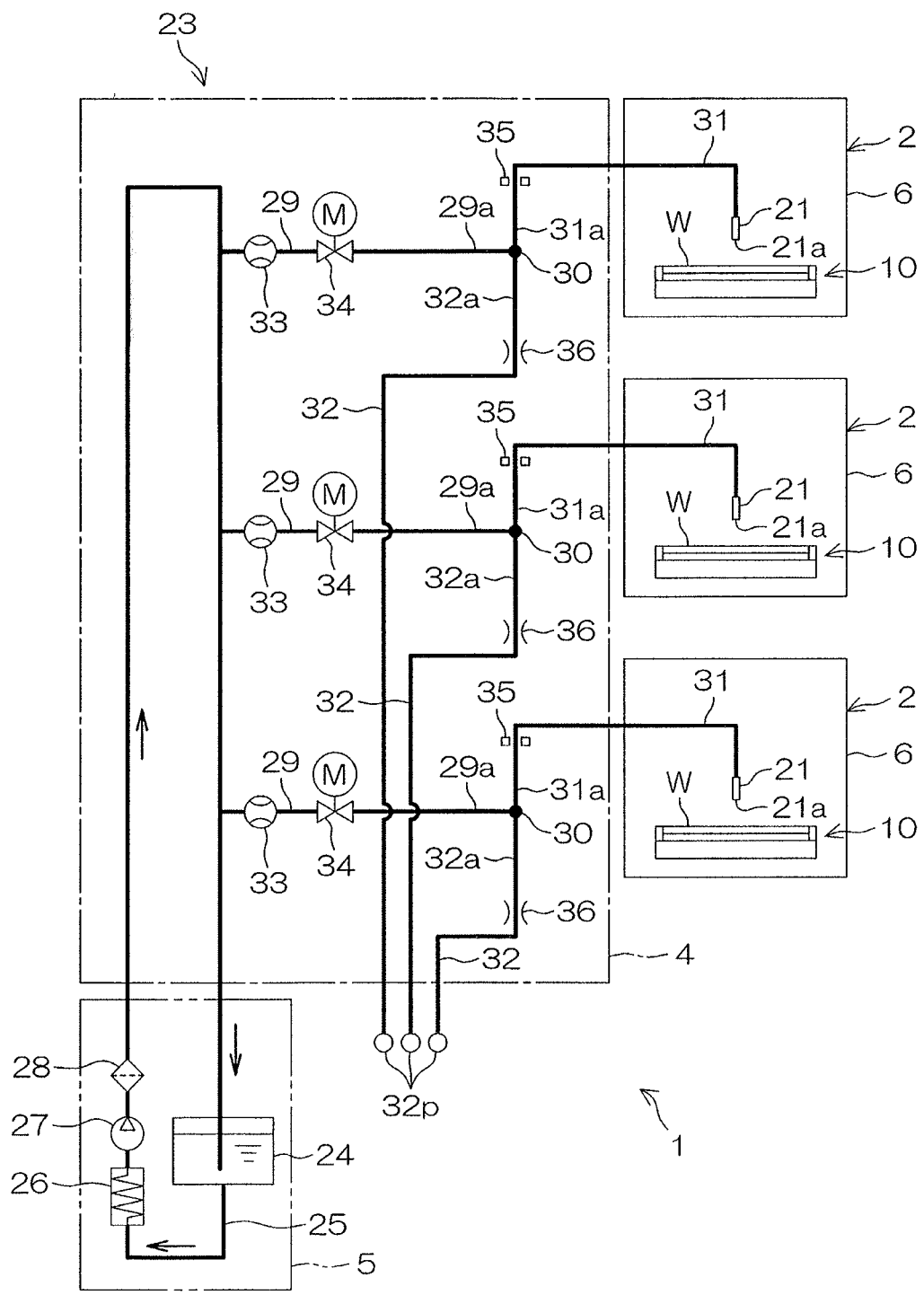
FIG. 9 is a schematic view which shows a chemical liquid supplying device which executes discharge of the chemical liquid.
Figure 10:
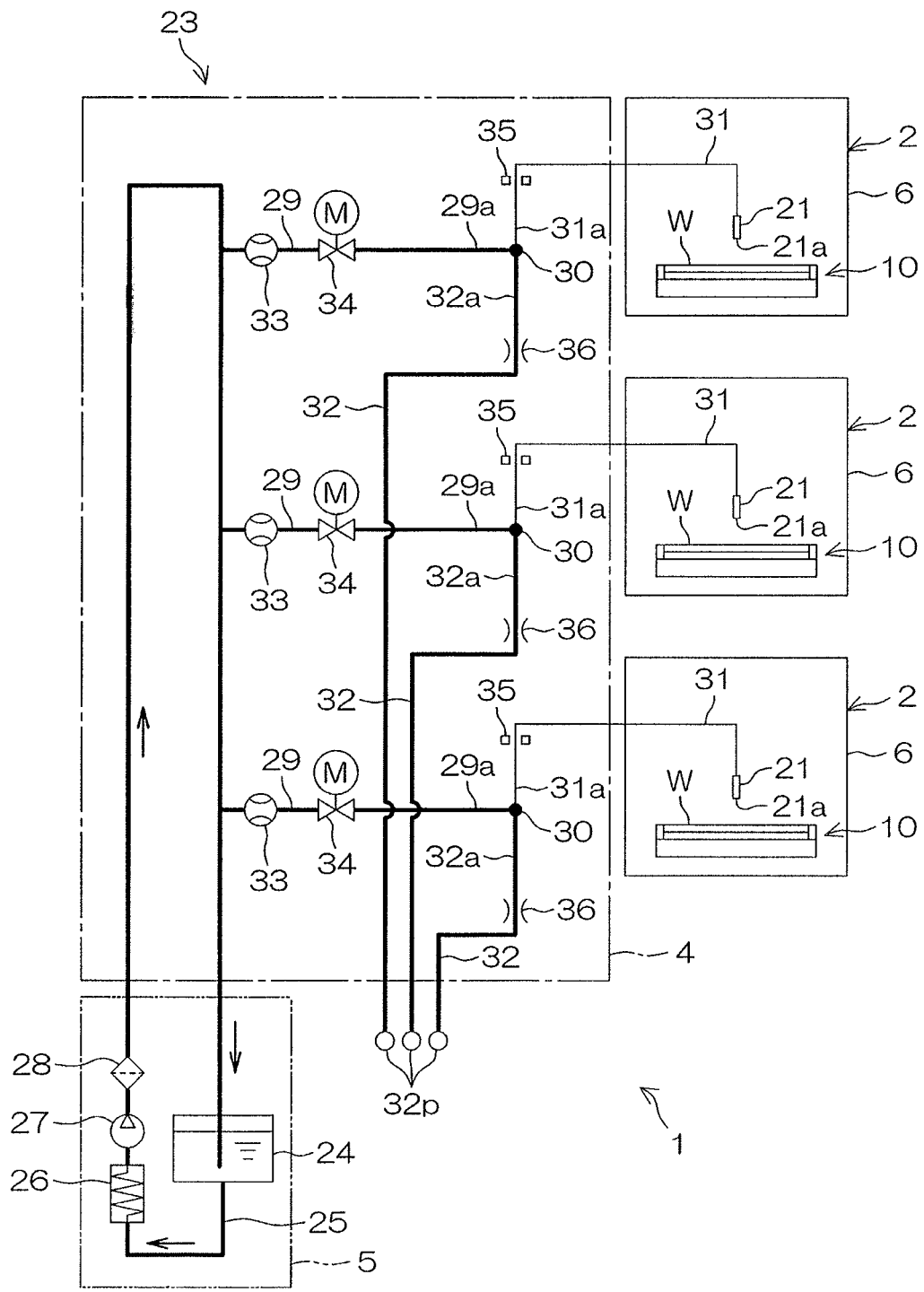
FIG. 10 is a schematic view which shows a chemical liquid supplying device when discharge of the chemical liquid is stopped.
Figure 11:
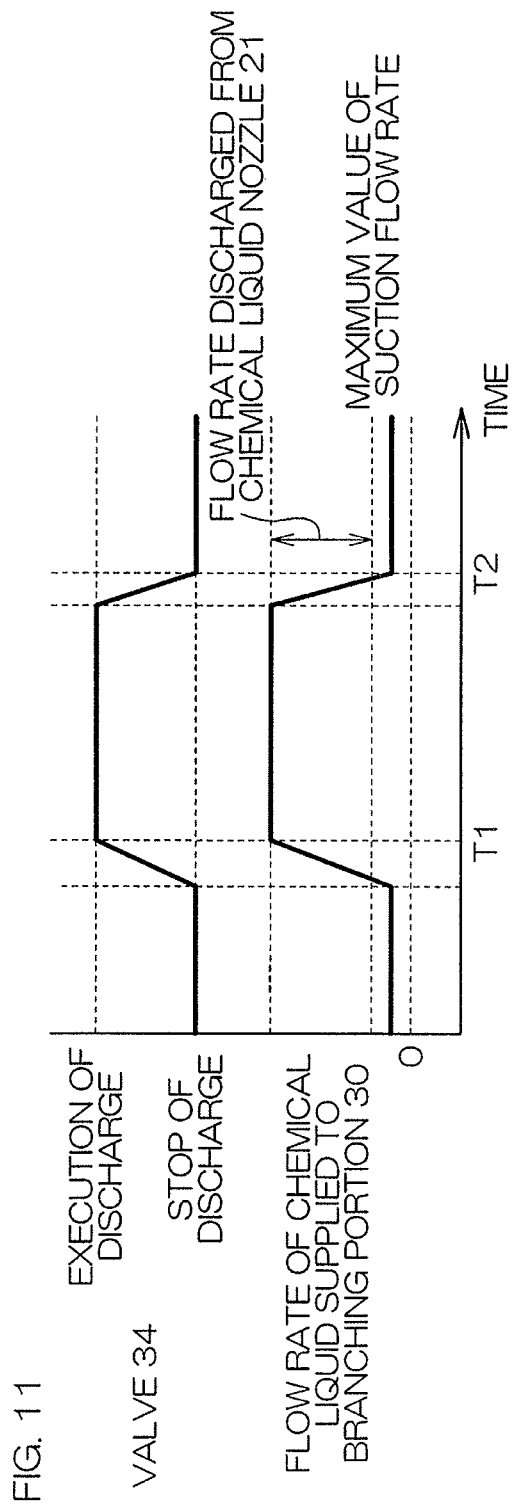
FIG. 11 is a graph which shows a temporal change between a position of the valve element of the discharge valve and a flow rate of the chemical liquid supplied to the branching portion.

FIG. 9 is a schematic view which shows the chemical liquid supplying device 23 when discharge of the chemical liquid is executed. FIG. 10 is a schematic view which shows the chemical liquid supplying device 23 when discharge of the chemical liquid is stopped. FIG. 11 is a graph which shows a temporal change between a position of the valve element 43 of the discharge valve 34 and a flow rate of the chemical liquid supplied to the branching portion 30.

When the chemical liquid is discharged from the chemical liquid nozzle 21, the controller 3 moves the valve element 43 of the discharge valve 34 from the discharge stop position to the discharge execution position, thereby switching the discharge valve 34 from a discharge stop state to a discharge execution state. Where the discharge valve 34 is the flow control valve 41A, the discharge execution position is the fully opened position or the high flow rate position, and the discharge stop position is the low flow rate position. Where the discharge valve 34 is the opening/closing valve 41B, the discharge execution position is the high flow rate position, and the discharge stop position is the low flow rate position.

As shown in FIG. 9, when the valve element 43 of the discharge valve 34 is arranged at the discharge execution position (Time T1 in FIG. 11), a part of the chemical liquid supplied from the common piping 29 to the branching portion 30 flows to the return piping 32. A remaining part of the chemical liquid supplied to the branching portion 30 flows from the branching portion 30 to the supply piping 31.

As shown in FIG. 11, this is because a flow rate (supply flow rate) of the chemical liquid supplied from the common piping 29 to the branching portion 30 is larger than a maximum value of a flow rate (suction flow rate) of the chemical liquid flowing from the branching portion 30 to the return piping 32. The flow rate of the chemical liquid supplied to the chemical liquid nozzle 21 is a value obtained by deducting the suction flow rate from the supply flow rate.

As shown in FIG. 10, when the valve element 43 of the discharge valve 34 is arranged at the discharge stop position (Time T2 in FIG. 11), all or substantially all the chemical liquid supplied from the common piping 29 to the branching portion 30 is supplied to the return piping 32. As shown in FIG. 11, this is because a flow rate (supply flow rate) of the chemical liquid supplied from the common piping 29 to the branching portion 30 is smaller than a maximum value of a flow rate (suction flow rate) of the chemical liquid flowing from the branching portion 30 to the return piping 32. Even if some chemical liquid flows from the branching portion 30 to the supply piping 31, the chemical liquid will not reach the liquid detecting sensor 35.

When the valve element 43 of the discharge valve 34 is arranged at the discharge execution position, an interior of the chemical liquid nozzle 21 and that of the supply piping 31 are filled with the chemical liquid supplied from the branching portion 30. Similarly, an interior of the return piping 32 is filled with the chemical liquid supplied from the branching portion 30. The exhaust port 32p of the return piping 32 is arranged below from a discharge port 21a of the chemical liquid nozzle 21. When the valve element 43 of the discharge valve 34 is arranged at the discharge stop position, the chemical liquid remaining in the chemical liquid nozzle 21 and the supply piping 31 flows backward toward the return piping 32 by the siphon principle and is expelled to the return piping 32. Thereby, it is possible to suppress or prevent occurrence of dripping.

As described above, the liquid detecting sensor 35 detects whether the chemical liquid is present in a detection position inside the elevating portion 31a of the supply piping 31 or not. When discharge of the chemical liquid is stopped, a detection position (a position at which the liquid detecting sensor 35 detects the presence or absence of the chemical liquid) inside the elevating portion 31a is made empty. Further, when discharge of the chemical liquid is executed, the elevating portion 31a is filled with the chemical liquid. After discharge of the chemical liquid has been stopped, the chemical liquid remaining in the elevating portion 31a flows to the return piping 32 due to a suction force resulting from the chemical liquid flowing from the common piping 29 to the return piping 32 and gravity, by which the detection position inside the elevating portion 31a is made empty.

On occurrence of the abnormality that the chemical liquid is supplied from the common piping 29 to the supply piping 31 although discharge of the chemical liquid is stopped, a liquid surface of the chemical liquid rises along the elevating portion 31a to fill the elevating portion 31a with the chemical liquid. The above-described abnormality can be detected by detecting the presence or absence of the chemical liquid at the elevating portion 31a. It is also possible to confirm that the chemical liquid is supplied to the supply piping 31 when discharge of the chemical liquid is executed. Further, it is possible to confirm that the supply piping 31 is made empty after discharge of the chemical liquid has been stopped.

Detection values of the liquid detecting sensor 35 are input in the controller 3. On occurrence of the above-described abnormality, the controller 3 may allow an alarm device 39 (refer to FIG. 1) to raise a warning, thereby notifying a supervisor in charge of maintenance of the substrate processing apparatus 1 of the abnormality. The alarm device 39 may be a display device which displays messages, a speech generation device which raises warning sounds, or a device which uses two or more of messages, sounds and light to notify the abnormality.

Further, on occurrence of the above-described abnormality, the controller 3 may allow the circulation pump 27 to stop sending of the chemical liquid. Where the discharge valve 34 is the flow control valve 41A shown in FIG. 5, on occurrence of the abnormality, the controller 3 may move the valve element 43 of the discharge valve 34 to the closed position, in addition to, or in place of stop of liquid sending. Thereby, supply of the chemical liquid from the common piping 29 to the branching portion 30 is stopped. It is, thus, possible to prevent discharge of the chemical liquid from the chemical liquid nozzle 21 although discharge of the chemical liquid is stopped.

As described above, in the first preferred embodiment, the chemical liquid to be supplied to the chemical liquid nozzle 21 is guided from the common piping 29 to the branching portion 30. The chemical liquid supplied from the branching portion 30 to the supply piping 31 is discharged from the chemical liquid nozzle 21 and supplied to a substrate W. Thereby, the substrate W is processed. On the other hand, the chemical liquid supplied from the branching portion 30 to the return piping 32 is guided by the return piping 32 to the recovery mechanism or the drain mechanism.

The chemical liquid supplied from the common piping 29 to the branching portion 30 drops on the return piping 32. The chemical liquid supplied from the common piping 29 to the branching portion 30 is changed in flow rate by the discharge valve 34. The discharge valve 34 moves the valve element 43 between the discharge execution position and the discharge stop position, by which the chemical liquid supplied from the common piping 29 to the branching portion 30 is changed in flow rate. Thereby, a mode of supplying the chemical liquid to the supply piping 31 is switched.

Specifically, a flow rate of the chemical liquid supplied from the common piping 29 to the branching portion 30 when the valve element 43 is arranged at the discharge execution position is larger than a maximum value of a flow rate of the chemical liquid flowing from the branching portion 30 to the return piping 32. Therefore, a part of the chemical liquid supplied to the branching portion 30 is supplied to the return piping 32, and a remaining part of the chemical liquid supplied to the branching portion 30 is supplied to the supply piping 31. Thereby, the chemical liquid is discharged from the chemical liquid nozzle 21 and supplied to the substrate W.

On the other hand, a flow rate of the chemical liquid supplied from the common piping 29 to the branching portion 30 when the valve element 43 is arranged at the discharge stop position is smaller than the maximum value of the flow rate of the chemical liquid flowing from the branching portion 30 to the return piping 32. Therefore, all or substantially all the chemical liquid supplied to the branching portion 30 is supplied to the return piping 32. Even if some chemical liquid flows from the branching portion 30 to the supply piping 31, the chemical liquid does not reach the chemical liquid nozzle 21. Therefore, no chemical liquid is discharged from the chemical liquid nozzle 21.

As described so far, whether discharge of the chemical liquid from the chemical liquid nozzle 21 is executed or stopped is not switched by opening or closing the supply piping 31 by the opening/closing valve but switched by changing an aperture of the discharge valve 34 disposed on the common piping 29. The discharge stop position at which discharge of the chemical liquid from the chemical liquid nozzle 21 is stopped is a position at which the valve element 43 is separated from the valve seat 44. Therefore, foreign matter contained in the chemical liquid supplied to the chemical liquid nozzle 21 is smaller than in the case where the supply piping 31 is opened and closed with the use of the opening/closing valve. Thereby, it is possible to suppress or prevent contamination of a substrate W by foreign matter contained in the chemical liquid and to improve cleanliness of the substrate W. In fact, it was confirmed that the number of particles remaining in the substrate W which has been processed decreased.

Further, since the supply piping 31 and the return piping 32 are always open, a suction force generated in the return piping 32 is transmitted to the supply piping 31 via the branching portion 30. The chemical liquid remaining in the chemical liquid nozzle 21 and the supply piping 31 immediately after discharge of the chemical liquid from the chemical liquid nozzle 21 has been stopped is drawn by the suction force to the return piping 32 and flows to the return piping 32 (suck back). Thereby, the chemical liquid remaining in the chemical liquid nozzle 21 and the supply piping 31 can be reduced in amount. As a result, it is also possible to suppress or prevent occurrence of dripping.

In addition, the return piping 32 is not opened or closed by the opening/closing valve but always open. Where the return piping 32 is closed by the opening/closing valve on discharge of the chemical liquid from the chemical liquid nozzle 21, there is a possibility that the chemical liquid inside the return piping 32 may flow backward and be supplied to the supply piping 31. In this case, the chemical liquid which contains particles generated at the opening/closing valve is discharged from the chemical liquid nozzle 21. Therefore, the return piping 32 is always maintained open thus making it possible to prevent the chemical liquid from flowing backward and also to decrease an amount of foreign matter contained in the chemical liquid.

In the first preferred embodiment, since the supply piping 31 extends upward from the branching portion 30, the chemical liquid is less likely to flow from the branching portion 30 to the supply piping 31. In contrast, since the return piping 32 extends downward from the branching portion 30, the chemical liquid is more likely to flow from the branching portion 30 to the return piping 32. The chemical liquid supplied from the common piping 29 to the branching portion 30 tries to flow to the return piping 32 as a result of gravity. Therefore, when discharge of the chemical liquid from the chemical liquid nozzle 21 is stopped, it is possible to suppress or prevent the chemical liquid from flowing from the branching portion 30 to the supply piping 31, resulting in discharge from the chemical liquid nozzle 21.

In the first preferred embodiment, the branching portion 30 is arranged inside the fluid box 4 and brought close to the chemical liquid nozzle 21. Therefore, the supply piping 31 extending from the branching portion 30 to the chemical liquid nozzle 21 is shortened. Thereby, the chemical liquid remaining in the supply piping 31 is decreased in amount, by which the chemical liquid remaining inside the supply piping 31 after suction of the chemical liquid inside the supply piping 31 to the return piping 32 can be decreased in amount. It is, thereby, possible to suppress or prevent occurrence of dripping.

In the first preferred embodiment, the chemical liquid supplied to the chemical liquid nozzle 21 is heated upstream of the supply piping 31. When discharge of the chemical liquid is stopped, the chemical liquid is not supplied from the common piping 29 to the supply piping 31 but supplied from the common piping 29 to the return piping 32. At this time, a temperature of the supply piping 31 is at or near a room temperature. Therefore, immediately after discharge of the chemical liquid has been started, the chemical liquid consequently undergoes a temperature change in the supply piping 31 and the chemical liquid nozzle 21.

The temperature change of the chemical liquid in the supply piping 31 can be reduced by shortening the supply piping 31. The branching portion 30 is arranged inside the fluid box 4 and brought close to the chemical liquid nozzle 21. Therefore, the supply piping 31 extending from the branching portion 30 to the chemical liquid nozzle 21 is shortened. Thereby, the chemical liquid can be decreased in temperature change in the supply piping 31. It is, therefore, possible to supply the chemical liquid with an intended temperature to the substrate W from the beginning.

In the first preferred embodiment, since the return piping 32 is decreased in flow channel area and increased in pressure loss thereof, resistance is applied to the chemical liquid which is to flow from the branching portion 30 to the return piping 32. Therefore, if the suction device is constant in suction force, the chemical liquid which flows from the branching portion 30 to the return piping 32 will be decreased in flow rate. It is possible to reduce consumption of the chemical liquid, where the chemical liquid inside the return piping 32 is guided by a drain mechanism.

Second Preferred Embodiment

Figure 12:
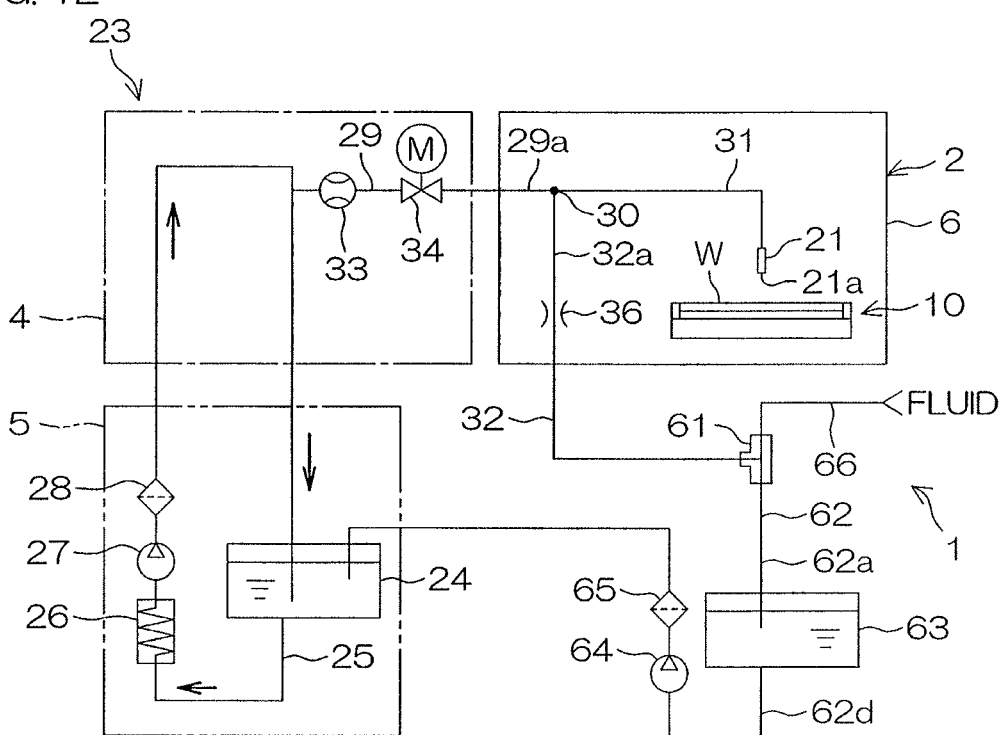
FIG. 12 is a schematic view which shows a chemical liquid supplying device according to a second preferred embodiment of the present invention.

FIG. 12 is a schematic view which shows a chemical liquid supplying device 23 according to a second preferred embodiment of the present invention. In FIG. 12, configurations similar to the previously described configurations shown in FIG. 1 to FIG. 11 will be given the same reference numbers as those of FIG. 1, etc., with a description thereof omitted.

In the second preferred embodiment, a substrate processing apparatus 1 includes an aspirator 61 which utilizes the Venturi effect to suck a chemical liquid from a branching portion 30 to return piping 32, and recovery piping 62 which guides the chemical liquid sucked by the aspirator 61 into a supply tank 24.

FIG. 12 shows an example in which the substrate processing apparatus 1 includes a recovery tank 63 which stores, upstream of the supply tank 24, the chemical liquid sucked by the aspirator 61, a recovery pump 64 which sends the chemical liquid inside the recovery tank 63 to the supply tank 24, and a recovery filter 65 which removes foreign matter from the chemical liquid between the aspirator 61 and the supply tank 24. In the case of the example shown in FIG. 12, the recovery piping 62 includes upstream recovery piping 62u which guides the chemical liquid from the aspirator 61 to the recovery tank 63, and downstream recovery piping 62d which guides the chemical liquid from the recovery tank 63 to the supply tank 24.

The aspirator 61 includes a supply port through which a fluid is supplied, an outlet from which the fluid is expelled, and a suction port which sucks the fluid. The fluid piping 66 for supplying a fluid such as a gas or a liquid is connected to the supply port of the aspirator 61. The upstream recovery piping 62u is connected to the outlet of the aspirator 61. The return piping 32 is connected to the suction port of the aspirator 61. When a fluid supplied from fluid piping 66 flows from the supply port to the outlet, a suction force for sucking a fluid into the suction port is generated. Thereby, such a suction force is generated that sucks the chemical liquid from the branching portion 30 to the return piping 32.

In the second preferred embodiment, the following effects can be obtained, in addition to the effects according to the first preferred embodiment. Specifically, whereas in the first preferred embodiment, the branching portion 30 is arranged inside the fluid box 4, in the second preferred embodiment, the branching portion 30 is arranged inside a chamber 6. Therefore, supply piping 31 which extends from the branching portion 30 to the chemical liquid nozzle 21 is shortened. Thereby, the chemical liquid remaining in the supply piping 31 is decreased in amount, thus making it possible to decrease an amount of the chemical liquid remaining inside the supply piping 31 after suction of the chemical liquid inside the supply piping 31 to the return piping 32. Thereby, it is possible to reliably suppress or prevent occurrence of dripping.

Third Preferred Embodiment

Figure 13:
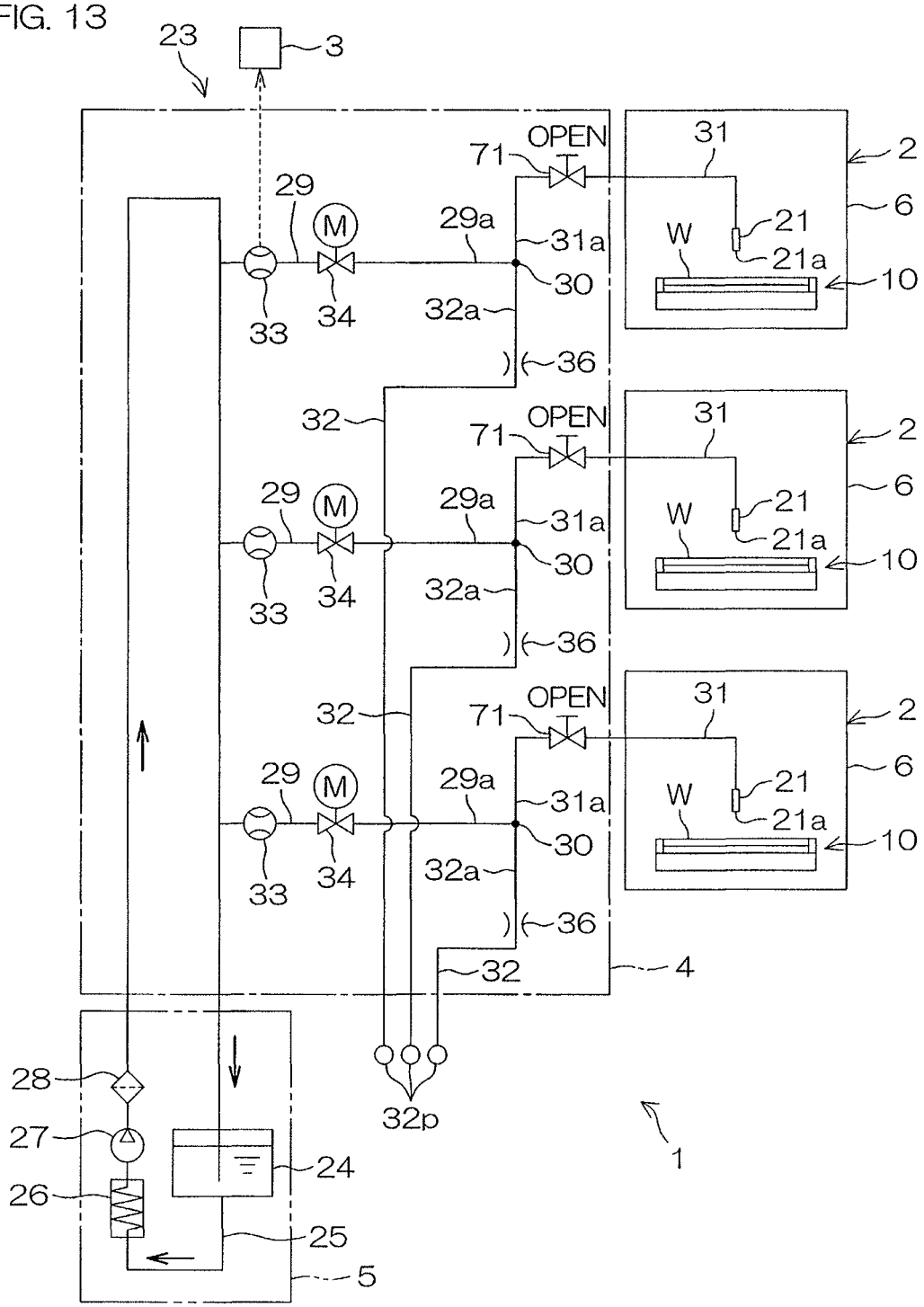
FIG. 13 is a schematic view which shows a chemical liquid supplying device according to a third preferred embodiment of the present invention.
Figure 14:
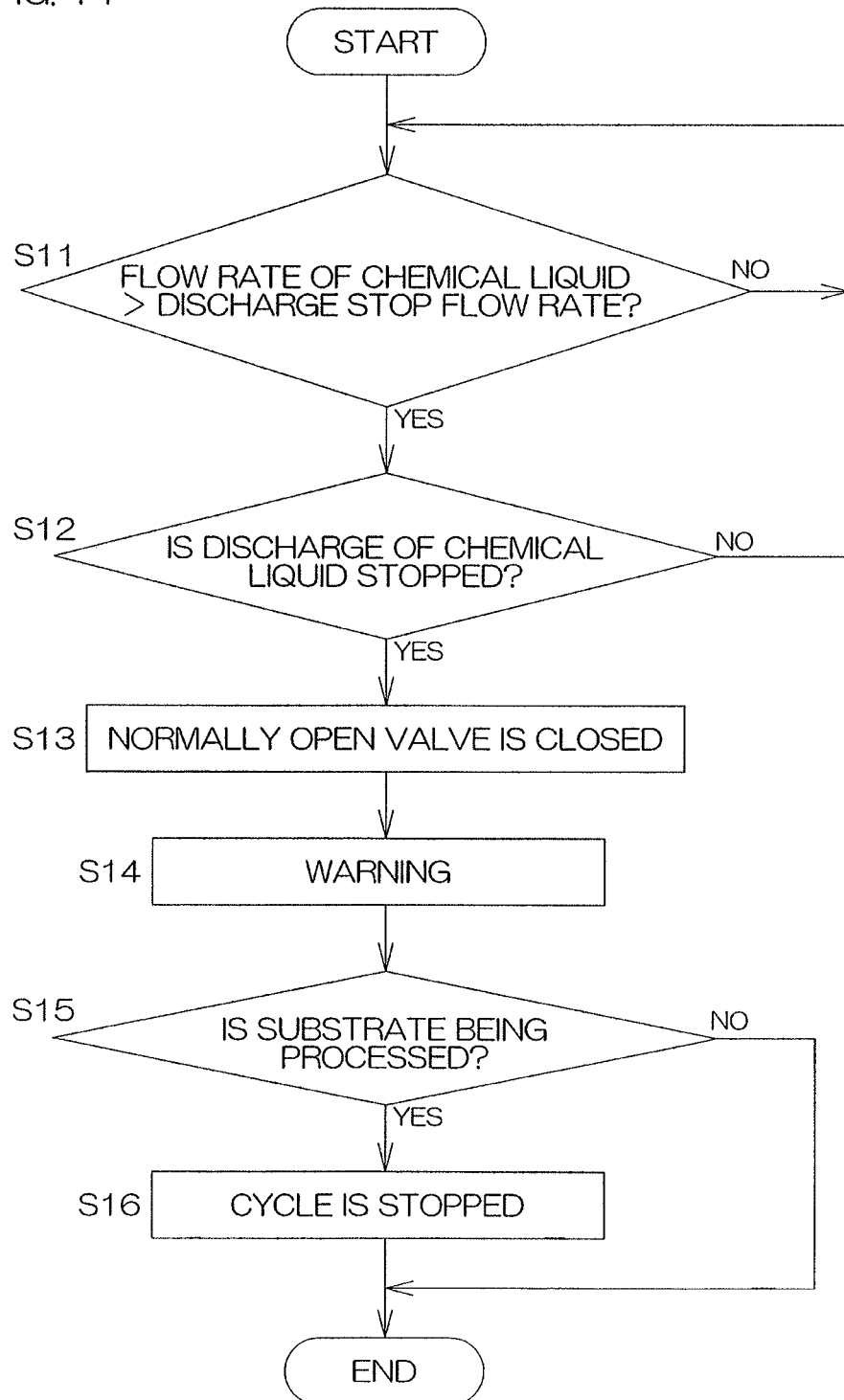
FIG. 14 is a flowchart which shows a flow of detection of occurrence of the abnormality that the chemical liquid is discharged continuously from the chemical liquid nozzle, although discharge of the chemical liquid from the chemical liquid nozzle has been stopped.
Figure 15:
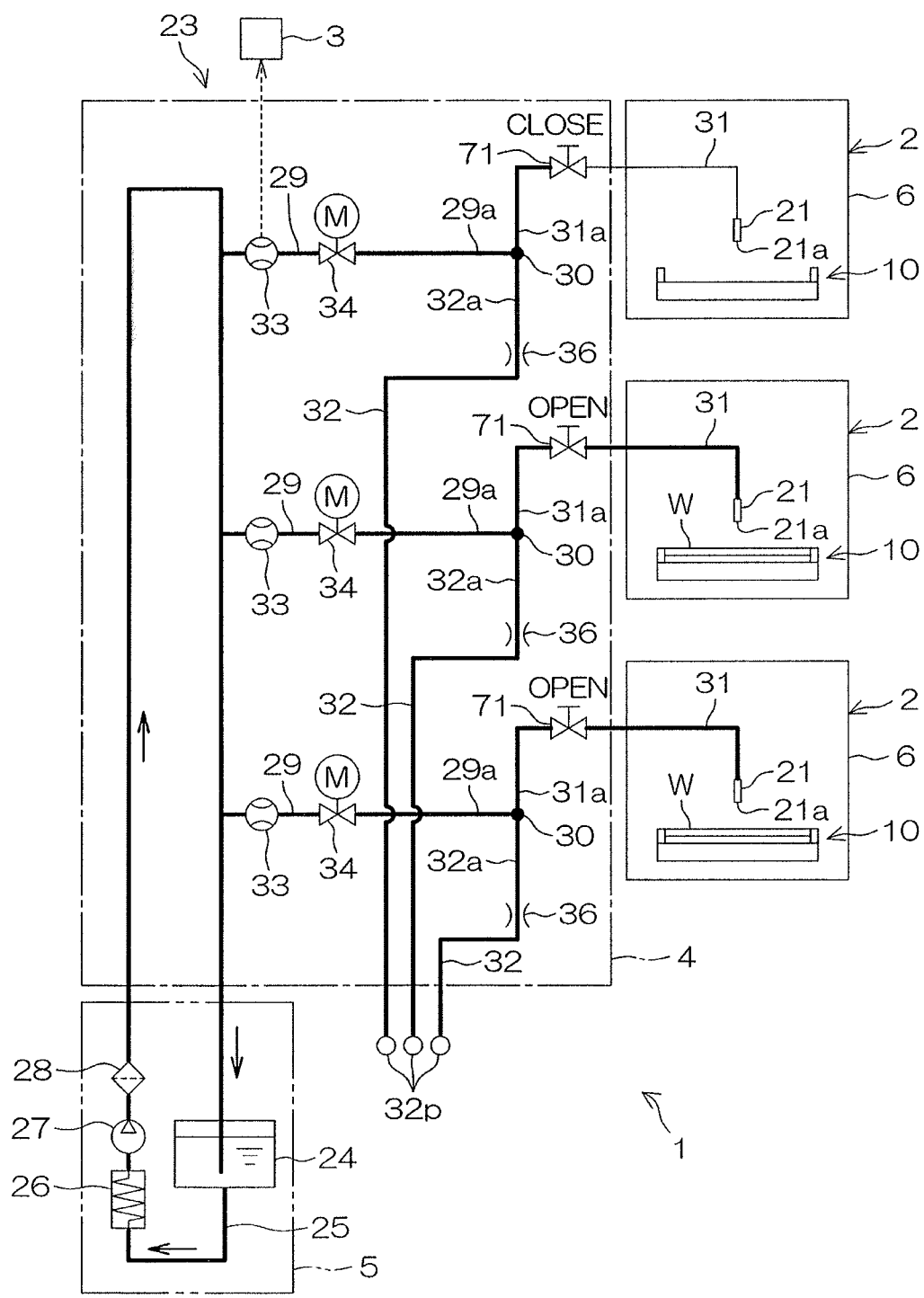
FIG. 15 is a schematic view which shows a chemical liquid supplying device in which, of three processing units included in the same tower, discharge of the chemical liquid is stopped at one processing unit and discharge of the chemical liquid is executed at the remaining two processing units.

FIG. 13 is a schematic view which shows a chemical liquid supplying device according to a third preferred embodiment of the present invention. In FIG. 13 to FIG. 15, configurations similar to the previously described configurations shown in FIG. 1 to FIG. 12 are given the same reference numbers as those of FIG. 1, etc., with a description thereof omitted.

The third preferred embodiment is different from the first preferred embodiment mainly in that a plurality of normally open valves 71 are disposed on a plurality of supply piping 31. The plurality of normally open valves 71 individually correspond to a plurality of discharge valves 34. The normally open valve 71 is always open except for the time of occurrence of an abnormality of the corresponding discharge valve 34. Therefore, except for the time of occurrence of the abnormality, no foreign matter is generated from a valve element of the normally open valve 71 in contact with a valve seat. The foreign matter is not discharged from a chemical liquid nozzle 21 together with a chemical liquid.

The normally open valve 71 is a pneumatic opening/closing valve. The normally open valve 71 may be an electrically operated valve. Although not shown in the drawing, the normally open valve 71 includes a valve body having an annular valve seat which surrounds an inner flow channel through which the chemical liquid flows, a valve element which is arranged on the inner flow channel and which is movable with respect to the valve seat, and a valve actuator which moves the valve element between an open position at which the valve element is separated from the valve seat and a closed position at which the valve element is in contact with the valve seat.

Next, a description will be given of an abnormality detection flow to detect an abnormality of the discharge valve 34.

FIG. 14 is a flowchart which shows a flow of detection of occurrence of the abnormality that the chemical liquid is continuously discharged from the chemical liquid nozzle 21, although discharge of the chemical liquid from the chemical liquid nozzle 21 is stopped. FIG. 15 is a schematic view which shows a chemical liquid supplying device in which, of three processing units 2 included in the same tower, discharge of the chemical liquid is stopped at one processing unit 2 and discharge of the chemical liquid is executed at the remaining two processing units 2. In the following description, "a discharge stop flow rate" represents a flow rate of the chemical liquid which passes through the discharge valve 34 when an valve element 43 (refer to FIG. 5 and FIG. 6) of the discharge valve 34 is arranged at a discharge stop position. Hereinafter, reference is made to FIG. 14 and FIG. 15.

A controller 3 monitors a detection value of a flowmeter 33 which is one example of an abnormality detector (Step S11 in FIG. 14). Where a detection value of the flowmeter 33 is lower than the discharge stop flow rate (No in Step S11 of FIG. 14), the controller 3 confirms again the detection value of the flowmeter 33 after the elapse of a predetermined period of time. Where the detection value of the flowmeter 33 is larger than the discharge stop flow rate (Yes in Step S11 of FIG. 14), the controller 3 confirms whether the discharge valve 34 is in a discharge stop state or not (Step S12 of FIG. 14). That is, it confirms whether the latest command input in the discharge valve 34 is a discharge stop command which moves the valve element 43 of the discharge valve 34 to a discharge stop position or not.

Where a detection value of the flowmeter 33 is in excess of the discharge stop flow rate although the latest command input in the discharge valve 34 is the discharge stop command, it is considered that, due to an abnormality of the discharge valve 34, the valve element 43 of the discharge valve 34 has not yet reached the discharge stop position. Therefore, where the latest command input in the discharge valve 34 is the discharge stop command (Yes in Step S12 of FIG. 14), the controller 3 judges that the abnormality has occurred to the discharge valve 34. Where the latest command input in the discharge valve 34 is not the discharge stop command, that is, where it is a discharge execution command by which the valve element 43 of the discharge valve 34 is moved to a discharge execution position (No in Step S12 of FIG. 14), the controller 3 confirms again a detection value of the flowmeter 33 after the elapse of a predetermined period of time (return to Step S11 of FIG. 14).

Where the controller 3 judges that the abnormality occurs to the discharge valve 34 (Yes in Step S12 of FIG. 14), the controller 3 closes the normally open valve 71 corresponding to the discharge valve 34 to which the abnormality occurs (Step S13 of FIG. 14). Thereby, it is possible to prevent discharge of the chemical liquid from the chemical liquid nozzle 21 corresponding to the discharge valve 34 to which the abnormality occurs. Further, the controller 3 allows an alarm device 39 (refer to FIG. 1) to raise a warning, thereby notifying a user of the substrate processing apparatus 1 that the abnormality has occurred to the discharge valve 34 (Step S14 of FIG. 14). The warning may be raised before or after the normally open valve 71 is closed or may be raised at the same time when the normally open valve 71 is closed.

FIG. 15 shows an example in which, of three discharge valves 34 corresponding to three processing units 2 included in the same tower, an abnormality occurs to only one discharge valve 34. In the case of this example, the controller 3 may close only one normally open valve 71 (the uppermost normally open valve 71 in FIG. 15) and maintain the remaining two normally open valves 71 open. In addition, the controller 3 may close the three normally open valves 71.

The controller 3 confirms whether or not there are any substrates W left to be processed by the chemical liquid discharged from the chemical liquid nozzle 21 corresponding to the discharge valve 34 to which the abnormality occurs, after judgment of occurrence of the abnormality to the discharge valve 34 (Step S15 of FIG. 14). Where there is left no substrate W to be processed, that is, where there is no substrate W inside a chamber 6 (hereinafter referred to as "abnormality chamber 6") which houses the chemical liquid nozzle 21 corresponding to the discharge valve 34 to which the abnormality has occurred and there is no substrate W either to be carried in the abnormality chamber 6 (No in Step S15 of FIG. 14), the controller 3 completes the abnormality detection flow.

Where there is a substrate W left to be processed (Yes in Step S15 of FIG. 14), the controller 3 allows no substrate W to be carried in the abnormality chamber 6 (Step S16 of FIG. 14). Further, where a substrate W is left inside the abnormality chamber 6 (Yes in Step S15 of FIG. 14), the controller 3 does not execute a rinse liquid supplying step (Step S3 of FIG. 3) or a drying step (Step S4 of FIG. 3) or allows a center robot CR to carry out the substrate W after execution of at least one of the rinse liquid supplying step and the drying step.

As described above, when the abnormality occurs to any of the discharge valves 34, the normally open valve 71 corresponding to the discharge valve 34 in question is closed to stop discharge of the chemical liquid from the chemical liquid nozzle 21 corresponding to the discharge valve 34 in question. Therefore, it is possible to prevent supply of the chemical liquid to a substrate W in an excessive amount or contamination of an interior or exterior of the chamber 6 by an atmosphere of the chemical liquid. It is also possible to save the chemical liquid consumption because wasteful discharge of the chemical liquid is eliminated after the normally open valve 71 has been closed.

In the third preferred embodiment, the following effects can be obtained in addition to the effects of the first preferred embodiment. Specifically, the controller 3 monitors an abnormality of the plurality of discharge valves 34 based on detection values of the plurality of flowmeters 33. On occurrence of the abnormality to any of the discharge valves 34, the controller 3 closes the normally open valve 71 corresponding to the discharge valve 34 to which the abnormality has occurred to stop supply of the chemical liquid from the supply piping 31 to the chemical liquid nozzle 21. Therefore, even on occurrence of the abnormality to the discharge valve 34, it is possible to reliably stop discharge of the chemical liquid from the chemical liquid nozzle 21.

Further, only the normally open valve 71 corresponding to the discharge valve 34 to which the abnormality has occurred is closed, thereby eliminating a necessity for closing the remaining normally open valves. As a result, it is not necessary to stop discharge of the chemical liquid from all the chemical liquid nozzles 21 corresponding to the same circulation pump 27. That is, even on occurrence of the abnormality to any of the discharge valves 34, it is possible to continue processing of a substrate W. Thereby, it is possible to prevent accidental discharge of the chemical liquid, with a decrease in throughput (the number of substrates W to be processed for a unit time) suppressed.

Other Preferred Embodiments

The present invention is not restricted to the contents of the above-described preferred embodiments and various modifications are possible.

For example, the liquid stored in the supply tank 24 is not limited to the chemical liquid but may be other liquids such as a rinse liquid.

The liquid detecting sensor 35 may detect whether the chemical liquid is present in a part of the supply piping 31 other than the elevating portion 31a or not. If no liquid detecting sensor 35 is needed, the liquid detecting sensor 35 may be omitted (refer to FIG. 12). Similarly, at least one of the circulation heater 26, the flowmeter 33 and the narrowing device 36 may be omitted.

If the flow control valve 41A is not needed to be closed, the annular portion 43a may be omitted from the valve element 43.

The supply piping 31 may extend upward from the branching portion 30 (refer to FIG. 12). Similarly, where suction devices such as the aspirator 61 and the suction pump are connected to the return piping 32, the return piping 32 may not extend downward from the branching portion 30.

In the second preferred embodiment, at least one of the recovery tank 63, the recovery pump 64 and the recovery filter 65 may be omitted. For example, where the recovery tank 63 is arranged above from the supply tank 24 such that the chemical liquid inside the recovery tank 63 flows to the supply tank 24 due to its own weight, the recovery pump 64 may be omitted.

The substrate processing apparatus 1 is not restricted to an apparatus that processes a disk-shaped substrate W and may be an apparatus that processes a polygonal substrate W.

Two or more of any of the arrangements described above may be combined. Two or more of any of the steps described above may be combined.

The present application corresponds to Japanese Patent Application Nos. 2017-031485 and 2017-207355 respectively filed on Feb. 22, 2017 and Oct. 26, 2017 in the Japan Patent Office, and the entire disclosure of these applications are incorporated herein by reference.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A substrate processing apparatus comprising:
a substrate holding unit which holds a substrate;
a nozzle which discharges a processing liquid toward the substrate held by the substrate holding unit;
a liquid sending device which sends the processing liquid to be supplied to the substrate held by the substrate holding unit,
common piping which guides the processing liquid sent by the liquid sending device and which is always open such that the processing liquid flows through the common piping;
a branching portion which is connected to the common piping;
supply piping which guides the processing liquid guided by the common piping from the branching portion to the nozzle and which is always open such that the processing liquid flows through the supply piping;
return piping which guides the processing liquid guided by the common piping from the branching portion along a flow channel different from the supply piping and which is always open such that the processing liquid flows through the return piping;
a suction device which sucks the processing liquid from the branching portion toward the return piping; and
a discharge valve which is disposed on the common piping and changes a flow rate of the processing liquid to be supplied from the common piping to the branching portion; wherein
the discharge valve includes
a valve body which includes an annular valve seat that surrounds an inner flow channel through which the processing liquid passes,
a valve element which is arranged on the inner flow channel and which is movable with respect to the valve seat,
a valve actuator which causes the valve element to be stationary at a plurality of positions including a discharge execution position at which the valve element is away from the valve seat and the processing liquid is supplied from the common piping to the branching portion at a flow rate larger than a maximum value of a suction flow rate which represents a flow rate of the processing liquid which flows from the branching portion to the return piping by a suction force of the suction device and a discharge stop position at which the valve element is away from the valve seat and the processing liquid is supplied from the common piping to the branching portion at a flow rate smaller than the maximum value of the suction flow rate, and
wherein the supply piping includes an elevating portion which extends upward toward a downstream side in a flow direction of the processing liquid, and
the substrate processing apparatus further comprises a liquid detecting sensor which detects whether the processing liquid is present in the elevating portion or not, and
a controller which is configured and programmed to cause the liquid sending device to stop sending the processing liquid when the valve element of the discharge valve is arranged at the discharge stop position and the liquid detecting sensor detects that the processing liquid is present in the elevating portion.

2. The substrate processing apparatus according to claim 1, wherein the supply piping includes an elevating portion which extends upward from the branching portion, and
the return piping includes a lowering portion which extends downward from the branching portion.

3. The substrate processing apparatus according to claim 1, wherein
the substrate processing apparatus further comprises a chamber which houses the substrate holding unit and a fluid box arranged laterally of the chamber, and
the branching portion is arranged inside the chamber or the fluid box.

4. The substrate processing apparatus according to claim 3 further comprising a temperature controller which changes a temperature of the processing liquid to be supplied to the nozzle by at least one of heating and cooling at a position upstream of the supply piping.

5. The substrate processing apparatus according to claim 1 further comprising a narrowing device which increases a pressure loss through the return piping by decreasing a flow channel area of the return piping.

6. A substrate processing apparatus comprising:
a substrate holding unit which holds a substrate;
a nozzle which discharges a processing liquid toward the substrate held by the substrate holding unit;
a liquid sending device which sends the processing liquid to be supplied to the substrate held by the substrate holding unit,
common piping which guides the processing liquid sent by the liquid sending device and which is always open such that the processing liquid flows through the common piping;
a branching portion which is connected to the common pipings
supply piping which guides the processing liquid guided by the common piping from the branching portion to the nozzle and which is always open such that the processing liquid flows through the supply piping;

return piping which guides the processing liquid guided by the common piping from the branching portion along a flow channel different from the supply piping and which is always open such that the processing liquid flows through the return piping;

a suction device which sucks the processing liquid from the branching portion toward the return piping; and a discharge valve which is disposed on the common piping and changes a flow rate of the processing liquid to be supplied from the common piping to the branching portion; wherein the discharge valve includes
- a valve body which includes an annular valve seat that surrounds an inner flow channel through which the processing liquid passes,
- a valve element which is arranged on the inner flow channel and which is movable with respect to the valve seat, and
- a valve actuator which causes the valve element to be stationary at a plurality of positions including a discharge execution position at which the valve element is away from the valve seat and the processing liquid is supplied from the common piping to the branching portion at a flow rate larger than a maximum value of a suction flow rate which represents a flow rate of the processing liquid which flows from the branching portion to the return piping by a suction force of the suction device and a discharge stop position at which the valve element is away from the valve seat and the processing liquid is supplied from the common piping to the branching portion at a flow rate smaller than the maximum value of the suction flow rate, wherein the valve actuator of the discharge valve is an electric actuator which makes the valve element stationary at any given position in a range from an open position at which the valve element is separated from the valve seat to a closed position at which the valve element is in contact with the valve seat, the discharge execution position and the discharge stop position are positions in the range from the open position to the closed position, the substrate processing apparatus further comprises a controller which is configured and programmed to stop a flow of the processing liquid in the common piping by causing the electric actuator to move the valve element to the closed position when the valve element of the discharge valve is arranged at the discharge stop position and the liquid detecting sensor detects that the processing liquid is present in the elevating portion, the supply piping includes an elevating portion which extends upward toward a downstream side in a flow direction of the processing liquid, and the substrate processing apparatus further comprises a liquid detecting sensor which detects whether the processing liquid is present in the elevating portion or not.

7. A substrate processing apparatus comprising:

a substrate holding unit which holds a substrate;

a nozzle which discharges a processing liquid toward the substrate held by the substrate holding unit;

a liquid sending device which sends the processing liquid to be supplied to the substrate held by the substrate holding unit, common piping which guides the processing liquid sent by the liquid sending device and which is always open such that the processing liquid flows through the common piping;

a branching portion which is connected to the common piping;

supply piping which guides the processing liquid guided by the common piping from the branching portion to the nozzle and which is always open such that the processing liquid flows through the supply piping;

return piping which guides the processing liquid guided by the common piping from the branching portion along a flow channel different from the supply piping and which is always open such that the processing liquid flows through the return piping;

a suction device which sucks the processing liquid from the branching portion toward the return piping; and a discharge valve which is disposed on the common piping and changes a flow rate of the processing liquid to be supplied from the common piping to the branching portion; wherein the discharge valve includes a valve body which includes an annular valve seat that surrounds an inner flow channel through which the processing liquid passes, a valve element which is arranged on the inner flow channel and which is movable with respect to the valve seat, and a valve actuator which causes the valve element to be stationary at a plurality of positions including a discharge execution position at which the valve element is away from the valve seat and the processing liquid is supplied from the common piping to the branching portion at a flow rate larger than a maximum value of a suction flow rate which represents a flow rate of the processing liquid which flows from the branching portion to the return piping by a suction force of the suction device and a discharge stop position at which the valve element is away from the valve seat and the processing liquid is supplied from the common piping to the branching portion at a flow rate smaller than the maximum value of the suction flow rate, a normally open valve which is disposed on the supply piping and always open except for a period during which an abnormality of the discharge valve is occurring, an abnormality detector which detects the abnormality of the discharge valve, and a controller which is configured and programmed to judge whether the abnormality occurs to the discharge valve or not based on a detection value of the abnormality detector and closes the normally open valve on judgment of occurrence of the abnormality.

\* \* \* \* \*